(12) United States Patent
Guler et al.

(10) Patent No.: US 12,557,363 B2
(45) Date of Patent: Feb. 17, 2026

(54) GATE CUT STRUCTURES FORMED BEFORE DUMMY GATE

(71) Applicant: Intel Corporation, Santa Clara, CA (US)

(72) Inventors: Leonard P. Guler, Hillsboro, OR (US); Madeleine Beasley, Beaverton, OR (US); Allen B. Gardiner, Portland, OR (US); Aryan Navabi Shirazi, Portland, OR (US); Tahir Ghani, Portland, OR (US); Sairam Subramanian, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 839 days.

(21) Appl. No.: 17/685,634

(22) Filed: Mar. 3, 2022

(65) Prior Publication Data
US 2023/0282483 A1 Sep. 7, 2023

(51) Int. Cl.
*H10D 84/00* (2025.01)
*H01L 21/02* (2006.01)
(Continued)

(52) U.S. Cl.
CPC .... *H01L 21/28123* (2013.01); *H01L 21/0259* (2013.01); *H10D 30/031* (2025.01);
(Continued)

(58) Field of Classification Search
CPC .......... H10D 84/0151; H10D 84/0153; H10D 84/038; H10D 84/83; H10D 84/832; H10D 30/6757; H10D 30/6735
See application file for complete search history.

(56) References Cited

U.S. PATENT DOCUMENTS 10,373,877 B1 * 8/2019 Wang ................... H10D 84/017
10,832,916 B1 * 11/2020 Xie .................... H01L 21/02603
(Continued)

FOREIGN PATENT DOCUMENTS

| EP | 4138122 A1 | 2/2023 |
| WO | 2021009579 A1 | 1/2021 |

OTHER PUBLICATIONS

Extended European Search Report received for EP Application No. 23154863.7, dated Jul. 4, 2023. 11 pages.

*Primary Examiner* — Reema Patel
(74) *Attorney, Agent, or Firm* — Arcane Law PLLC

(57) ABSTRACT

Techniques are provided herein to form semiconductor devices having self-aligned gate cut structures. In an example, neighboring semiconductor devices each include a semiconductor region extending between a source region and a drain region, and a gate structure extending over the semiconductor regions of the neighboring semiconductor devices. A gate cut structure that includes a dielectric material interrupts the gate structure between the neighboring semiconductor devices. Due to the process of forming the gate cut structure, the distance between the gate cut structure and the semiconductor region of one of the neighboring semiconductor devices is substantially the same as (e.g., within 1.5 nm of) the distance between the gate cut structure and the semiconductor region of the other one of the neighboring semiconductor devices and the gate cut structure extends beyond the width of the gate structure to also interrupt gate spacers on the sidewalls of the gate structure.

20 Claims, 16 Drawing Sheets

(51) Int. Cl.
    *H01L 21/28*     (2006.01)
    *H10D 30/01*     (2025.01)
    *H10D 30/67*     (2025.01)
    *H10D 62/10*     (2025.01)
    *H10D 84/01*     (2025.01)
    *H10D 84/03*     (2025.01)
    *H10D 84/83*     (2025.01)

(52) U.S. Cl.
    CPC ..... *H10D 30/6735* (2025.01); *H10D 30/6757* (2025.01); *H10D 62/118* (2025.01); *H10D 84/0128* (2025.01); *H10D 84/0151* (2025.01); *H10D 84/0153* (2025.01); *H10D 84/038* (2025.01); *H10D 84/83* (2025.01)

(56) References Cited

U.S. PATENT DOCUMENTS

| | | | |
|---|---|---|---|
| 2017/0256458 A1 | 9/2017 | Chang et al. | |
| 2017/0372979 A1* | 12/2017 | Gandhi | H01L 23/3675 |
| 2021/0020636 A1 | 1/2021 | Lee et al. | |
| 2021/0335670 A1 | 10/2021 | Ko et al. | |

* cited by examiner

GATE CUT STRUCTURES FORMED BEFORE DUMMY GATE

FIELD OF THE DISCLOSURE

The present disclosure relates to integrated circuits, and more particularly, to gate cut structures.

BACKGROUND

As integrated circuits continue to scale downward in size, a number of challenges arise. For instance, reducing the size of memory and logic cells is becoming increasingly more difficult. Certain aspects of lithography technology can impose physical limits on how accurately certain structures can be aligned. Alignment errors can lead to low yield and/or devices that operate slightly differently from one another which can cause timing errors or other failures. Accordingly, there remain a number of non-trivial challenges with respect to structure alignment in semiconductor devices.

Figure 1A:
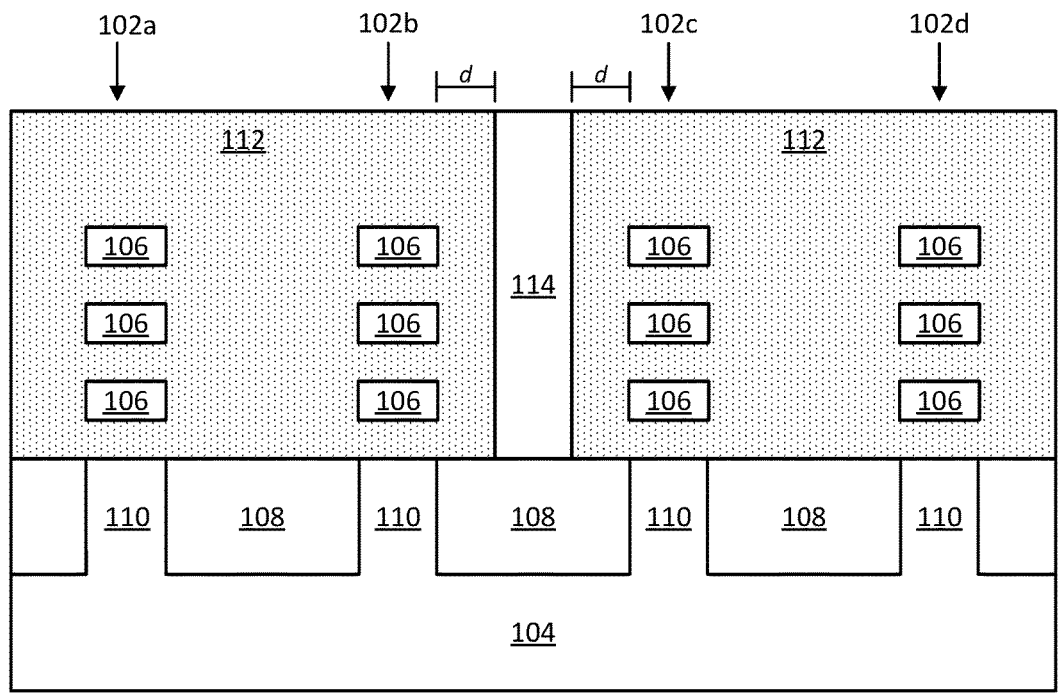
FIG. 1A is a cross-sectional view and FIG. 1B is a plan view of an integrated circuit including one or more gate cut structures that are self-aligned between adjacent devices, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used.

DETAILED DESCRIPTION

Techniques are provided herein to form semiconductor devices having self-aligned gate cut structures. The techniques can be used in any number of integrated circuit applications and are particularly useful with respect to logic and memory cells, such as those cells that use finFETs or gate-all-around transistors (e.g., ribbonFETs and nanowire FETs). In an example, neighboring semiconductor devices each include a semiconductor region extending between a source region and a drain region, and a gate structure extending over the semiconductor regions of the neighboring semiconductor devices. A gate cut structure that includes a dielectric material interrupts the gate structure between the neighboring semiconductor devices thus isolating the gate of one semiconductor device from the gate of the other semiconductor device. Due to the process of forming the gate cut structure, the distance between the gate cut structure and the semiconductor region of one of the neighboring semiconductor devices is substantially the same as the distance between the gate cut structure and the semiconductor region of the other one of the neighboring semiconductor devices (e.g., such as the example case where the two distances are within 1 nm of each other, or closer). Furthermore, the gate cut structure extends beneath the spacer structures along the sides of the gate layer to provide better isolation between the gate of one semiconductor device from the gate of the other semiconductor device. The alignment of the gate cut structure is nearly impossible to consistently achieve using conventional masking techniques. Numerous variations and embodiments will be apparent in light of this disclosure.

General Overview

As previously noted above, there remain a number of non-trivial challenges with respect to alignment of particular semiconductor structures. In more detail, a gate cut structure is sometimes provided between adjacent semiconductor devices to isolate first and second portions of a gate structure that crosses over each of the adjacent semiconductor devices. Accordingly, a gate cut structure can be used to isolate the gates of two devices from one another. Ideally, the gate cut structure is to be placed directly in the middle between the adjacent semiconductor devices to ensure the same amount of gate material around all sides of each of the semiconductor regions of the semiconductor devices. In practice, however, this is difficult to achieve as alignment tolerances during the masking and lithography process often cause the gate cut to be formed closer to one semiconductor region than the other. Furthermore, standard gate cut structures only fill the gate trench area, which can lead to potential shorting around the gate cut structure.

Thus, and in accordance with an embodiment of the present disclosure, techniques are provided herein to form self-aligned gate cut structures and a more robust design that eliminates or otherwise reduces the possibility of shorting. During the formation of the semiconductor devices, spacer structures are formed on the sidewalls of adjacent semiconductor fins to form a region between the spacer structures that is self-aligned to be centralized between the adjacent semiconductor fins. This region can be filled with a sacrificial material that has sufficient etch selectivity to the material used for the spacers in order to selectively remove the sacrificial material and replace it with a suitable gate cut material, such as silicon nitride. Ultimately, the resulting gate cut structures are self-aligned between a first and a second adjacent semiconductor device such that the distance between the gate cut structure and the semiconductor region of the first semiconductor device is substantially the same (e.g., within 1 nm) as the distance between the gate cut structure and the semiconductor region of the second semiconductor device. Additionally, the gate cut structures may be formed before the gate structure has been patterned (using, for example, a sacrificial or dummy gate material). Accordingly, the gate cut structures may extend across the finally formed gate structure and extend beneath the spacer structures on the sidewalls of the gate structure, thus providing enhanced isolation between the gates on either side of the gate cut structure.

As used herein, distances that are substantially the same to one another are within 1.5 nm of each other according to some embodiments, such as the example case where the distances are within 1 nm or less of each other, or the example case where the distances are within 0.5 nm or less of each other. In any such cases, the distance can be measured at a consistent height or otherwise within the same imaginary horizontal plane that passes through each of the semiconductor regions and the gate cut structure, such as at the one-third-point or midpoint of the gate cut structure, or a midpoint of the gated portion of the fins.

According to an embodiment, an integrated circuit includes a first semiconductor device having a first semiconductor region extending between a first source region and a first drain region, and a second semiconductor device having a second semiconductor region extending between a second source region and a second drain region. The integrated circuit further includes a gate structure comprising a conductive material that extends over the first semiconductor region and the second semiconductor region, a spacer layer on sidewalls of the gate structure, and a gate cut structure that comprises a dielectric material. The gate cut structure is between the first semiconductor device and the second semiconductor device, such that the gate cut structure interrupts both the gate structure and the spacer layer. A first distance between the gate cut structure and the first semiconductor region is substantially the same as a second distance between the gate cut structure and the second semiconductor region (e.g., such as the example case where the two distances are within 1 nm of each other, or closer.)

According to another embodiment, a method of forming an integrated circuit includes forming a first fin comprising first semiconductor material and a second fin comprising second semiconductor material, wherein the first fin and the second fin extend parallel to one another, the first fin having a first cap structure on a top surface of the first fin and the second fin having a second cap structure on a top surface of the second fin; forming a first spacer structure comprising a first material on at least a first side of the first fin facing the second fin and a second spacer structure comprising the first material on at least a second side of the second fin facing the first fin; depositing a second material into a region between the first and second spacer structures and into regions between other spacer structures across the integrated circuit, the second material being etch selective with respect to the first material; removing the second material from between the first and second spacer structures and replacing the removed second material with a dielectric material; and forming a gate structure over the first semiconductor material and over the second semiconductor material and forming gate spacers on sidewalls of the gate structure, wherein the dielectric material interrupts the gate structure between the first semiconductor material and the second semiconductor material and extends beneath the gate spacers.

The techniques can be used with any type of non-planar transistors, including finFETs (sometimes called double-gate transistors, or tri-gate transistors), or nanowire and nanoribbon transistors (sometimes called gate-all-around transistors), to name a few examples. The source and drain regions can be, for example, doped portions of a given fin or substrate, or epitaxial regions that are deposited during an etch-and-replace source/drain forming process. The dopant-type in the source and drain regions will depend on the polarity of the corresponding transistor. The gate structure can be implemented with a gate-first process or a gate-last process (sometimes called a replacement metal gate, or RMG, process), or any other gate formation process. Any number of semiconductor materials can be used in forming the transistors, such as group IV materials (e.g., silicon, germanium, silicon germanium) or group III-V materials (e.g., gallium arsenide, indium gallium arsenide).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate substantially the same distance between the gate cut structure and each of the semiconductor regions of adjacent semiconductor devices, as variously explained herein (e.g., where the distances between the gate cut structure and each of the semiconductor regions of adjacent semiconductor devices are within 1.5 nm or less of each other, such as within 1 nm of each other). In some other example embodiments, such tools may indicate one or more gate cut structures that extend across a gate layer and continue beneath gate spacers on sidewalls of the gate layer. In some cases, a seam may be observed in the center of the gate cut structure due to its deposition process where the seam has a same or longer length compared to a width of the gate layer. Numerous configurations and variations will be apparent in light of this disclosure.

It should be readily understood that the meaning of "above" and "over" in the present disclosure should be interpreted in the broadest manner such that "above" and "over" not only mean "directly on" something but also include the meaning of over something with an intermediate feature or a layer therebetween. Further, spatially relative terms, such as "beneath," "below," "lower," "above," "upper," "top," "bottom," and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the material has an element that is not in the other material.

Architecture

FIG. 1A is a cross sectional view taken across a plurality of semiconductor devices 102a-102d, according to an embodiment of the present disclosure. Each of semiconductor devices 102a-102d may be non-planar metal oxide semiconductor (MOS) transistors, such as tri-gate or gate-all-around (GAA) transistors, although other transistor topologies and types could also benefit from the techniques provided herein. The examples herein illustrate semiconductor devices with a GAA structure (e.g., having nanoribbons that extend between source and drain regions).

As can be seen, semiconductor devices 102a-102d are formed over a substrate 104. Any number of semiconductor devices can be formed on or over substrate 104, but four are used here as an example. Substrate 104 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, the substrate can be a semiconductor-on-insulator substrate having a desired semiconductor layer over a buried insulator layer (e.g., silicon over silicon dioxide). Alternatively, the substrate can be a multilayer substrate or superlattice suitable for forming nanowires or nanoribbons (e.g., alternating layers of silicon and SiGe, or alternating layers indium gallium arsenide and indium phosphide). Any number of substrates can be used.

Each of semiconductor devices 102a-102d includes one or more nanoribbons 106 that extend parallel to one another along a direction between a source region and a drain region (e.g., into and out of the page in the cross-section view of FIG. 1A). Nanoribbons 106 are one example of semiconductor regions that extend between source and drain regions. The semiconductor material of nanoribbons 106 may be formed from substrate 104. In some embodiments, semiconductor devices 102a-102d may each include semiconductor regions in the shape of fins that can be, for example, native to substrate 104 (formed from the substrate itself), such as silicon fins etched from a bulk silicon substrate. Alternatively, the fins can be formed of material deposited onto an underlying substrate. In one such example case, a blanket layer of silicon germanium (SiGe) can be deposited onto a silicon substrate, and then patterned and etched to form a plurality of SiGe fins extending from that substrate. In another such example, non-native fins can be formed in a so-called aspect ratio trapping based process, where native fins are etched away so as to leave fin-shaped trenches which can then be filled with an alternative semiconductor material (e.g., group IV or III-V material). In still other embodiments, the fins include alternating layers of material (e.g., alternating layers of silicon and SiGe) that facilitates forming of the illustrated nanoribbons 106 during a gate forming process where one type of the alternating layers are selectively etched away so as to liberate the other type of alternating layers within the channel region, so that a gate-all-around (GAA) process can then be carried out. Again, the alternating layers can be blanket deposited and then etched into fins, or deposited into fin-shaped trenches.

As can further be seen, adjacent semiconductor devices are separated by a dielectric fill 108 that may include silicon oxide. Dielectric fill 108 provides shallow trench isolation (STI) between any adjacent semiconductor devices. Dielectric fill 108 can be any suitable dielectric material, such as silicon dioxide, aluminum oxide, or silicon oxycarbonitride.

Semiconductor devices 102a-102d each include a subfin region 110. According to some embodiments, subfin region 110 comprises the same semiconductor material as substrate 104 and is adjacent to dielectric fill 108. According to some embodiments, nanoribbons 106 (or other semiconductor structures) are present above the top surface of subfin region 110 and provide an active region for each transistor (e.g., the semiconductor region beneath the gate).

As noted above, nanoribbons 106 extend between a source region and a drain region. The source and drain regions are not shown in this particular cross-section. According to some embodiments, the source and drain regions are epitaxial regions that are provided on the fins in an etch-and-replace process. In other embodiments one or both of the source and drain regions could be, for example, implantation-doped native portions of the fins or substrate. Any semiconductor materials suitable for source and drain regions can be used (e.g., group IV and group III-V semiconductor materials). The source and drain regions may include multiple layers such as liners and capping layers to improve contact resistance. In any such cases, the composition and doping of the source and drain regions may be the same or different, depending on the polarity of the transistors. In an example, for instance, one transistor is a p-type MOS (PMOS) transistor, and the other transistor is an n-type MOS (NMOS) transistor. Any number of source and drain configurations and materials can be used.

According to some embodiments, a gate structure 112 extends over nanoribbons 106 of semiconductor devices 102a-102d. It should be noted that one or more gate dielectric layers are also a part of gate structure 112 around nanoribbons 106 and is not shown for clarity. Gate structure 112 may include any sufficiently conductive material such as a metal, metal alloy, or doped polysilicon. In some embodiments, gate structure 112 includes one or more workfunction metals around nanoribbons 106. In some embodiments, semiconductor devices 102a and 102b are p-channel devices that include a workfunction metal having titanium around its nanoribbons 106 and semiconductor devices 102c and 102d are n-channel devices that include a workfunction metal having tungsten around its nanoribbons 106. Gate structure 112 may also include a fill metal or other conductive material around the workfunction metals to provide the whole gate electrode structure.

According to some embodiments, gate structure 112 may be interrupted between any adjacent semiconductor devices by a gate cut structure such as gate cut 114. The gate cut structures effectively isolate portions of gate structure 112 from one another to form electrically separate gates for certain semiconductor devices. In the illustrated example, a portion of gate structure 112 connects the gates of both semiconductor devices 102a and 102b while another portion of gate structure 112 connects the gates of both semiconductor devices 102c and 102d with gate cut 114 providing the isolation between the gate layers.

Gate cut 114 may be formed from a sufficiently insulating material, such as a dielectric material. Example materials for gate cut 114 include silicon nitride, silicon oxide, or silicon oxynitride. According to some embodiments, gate cut 114 is formed using a spacer process, as will be discussed herein, which self-aligns gate cut 114 at the midpoint between adjacent semiconductor devices (such as between semiconductor device 102b and semiconductor device 102c). Accordingly, the gate cut structures may each be aligned at a distance d from the adjacent semiconductor regions of the adjacent semiconductor devices (e.g., nanoribbons 106 of adjacent semiconductor devices 102b and 102c). As noted above, each distance d is substantially the same (e.g., each distance d is within 1 nm of each other, or within 5 angstroms of each other). The distance d may vary between applications, but in some examples is between about 5 nm and about 25 nm. Further note that distance d can be measured in a consistent fashion, such as the example case where distance d is measured in an imaginary horizontal plane that passes through a top nanoribbon 106 of each semiconductor device. Since the size of a given gate cut structure is determined by the distance between the adjacent semiconductor structures, gate cut structures of different sizes (e.g., different widths) can be formed across the integrated circuit. Furthermore, since the gate cut structures do not rely on traditional lithographic patterning, they can be made very small. In some embodiments, gate cut 114 has a width between about 5 nm and about 20 nm.

Figure 1B:
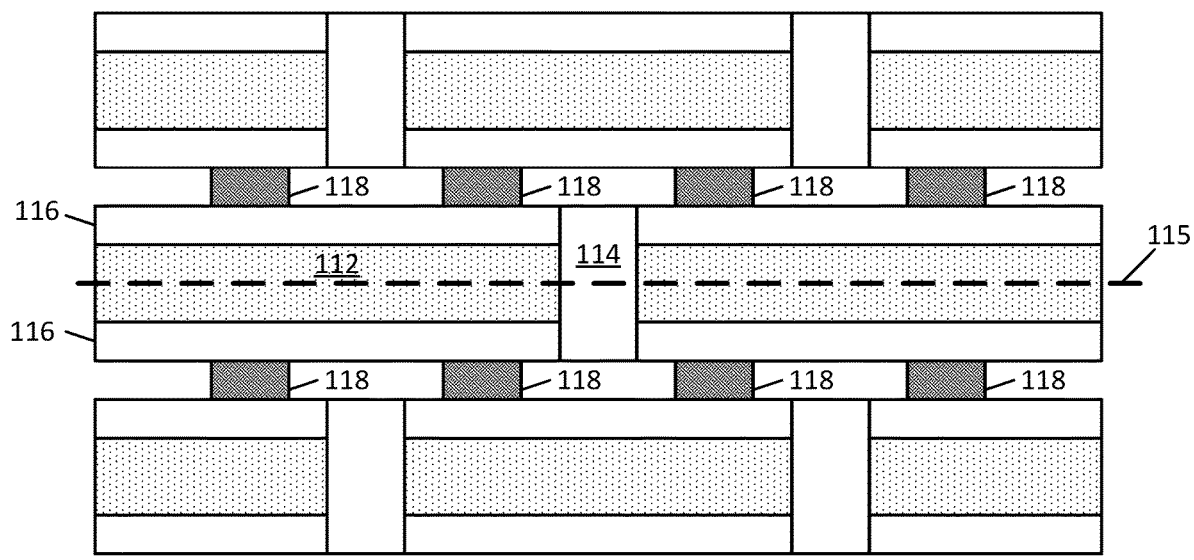

FIG. 1B illustrates a plan view of an integrated circuit that includes each of semiconductor devices 102a-102d. The dashed line identifies a plane 115 through which the cross-section of FIG. 1A is taken. Spacer layers 116 are provided along sidewalls of gate structure 112 as would be understood to one skilled in the relevant art and may include any suitable dielectric material, such as silicon nitride or silicon oxynitride.

The various semiconductor regions of the semiconductor devices extend between source or drain regions 118. Any of source or drain regions 118 may act as either a source region or a drain region, depending on the application and dopant profile. Any semiconductor materials suitable for source and drain regions can be used (e.g., group IV and group III-V semiconductor materials) for any of the illustrated source or drains regions 118. In any such cases, the composition and doping of source or drain regions 118 may be the same or different, depending on the polarity of the transistors. In an example, for instance, semiconductor devices 102a and 102b are p-type MOS (PMOS) transistors having a high concentration of p-type dopants in the associated source or drain regions 118, and semiconductor devices 102c and 102d are n-type MOS (NMOS) transistors having a high concentration of n-type dopants in the associated source or drain regions 118. Any number of source and drain configurations and materials can be used.

According to some embodiments, gate cut 114 interrupts both gate structure 112 and also spacer layers 116 on either side of gate structure 112. In some embodiments, spacer layers 116 extend over a top surface of gate cut 114. In some embodiments, gate cut 114 extends further beyond the edge of one or both spacer layers 116. By extending into spacer layers 116, gate cut 114 provides superior isolation compared to structures formed only within the gate trench between spacer layers 116.

Fabrication Methodology

FIGS. 2A-12A and 2B-12B are cross-sectional and plan views, respectively, that collectively illustrate an example process for forming an integrated circuit configured with self-aligned gate cut structures, in accordance with an embodiment of the present disclosure. FIGS. 2A-12A represent a cross-sectional view taken across plane 115 shown in FIG. 1B, while FIGS. 2B-11B represent the corresponding plan view across a portion of the integrated circuit. Each figure shows an example structure that results from the process flow up to that point in time, so the depicted structure evolves as the process flow continues, culminating in the structure shown in FIGS. 12A and 12B, which is similar to the structure shown in FIGS. 1A and 1B. Such a structure may be part of an overall integrated circuit (e.g., such as a processor or memory chip) that includes, for example, digital logic cells and/or memory cells and analog mixed signal circuitry. Thus, the illustrated integrated circuit structure may be part of a larger integrated circuit that includes other integrated circuitry not depicted. Example materials and process parameters are given, but the present disclosure is not intended to be limited to any specific such materials or parameters, as will be appreciated. Figures sharing the same number (e.g., FIGS. 2A and 2B) illustrate different views of the structure at the same point in time during the process flow.

Figure 2A:
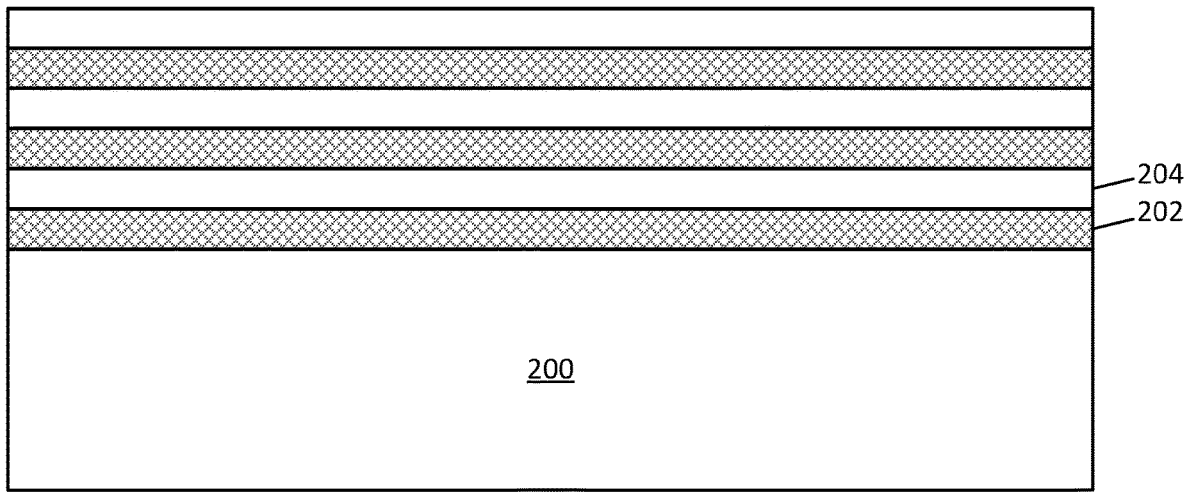
FIGS. 2A and 2B are cross-sectional and plan views, respectively, that illustrate one stage in an example process for forming an integrated circuit configured with self-aligned gate cut structures, in accordance with an embodiment of the present disclosure.

FIG. 2A illustrates a cross-sectional view taken through a substrate 200 having a series of material layers formed over the substrate, according to an embodiment of the present disclosure. Alternating material layers may be deposited over substrate 200 including sacrificial layers 202 alternating with semiconductor layers 204. The alternating layers are used to form GAA transistor structures. Any number of alternating semiconductor layers 204 and sacrificial layers 202 may be deposited over substrate 200.

According to some embodiments, sacrificial layers 202 have a different material composition than semiconductor layers 204. In some embodiments, sacrificial layers 202 are silicon germanium (SiGe) while semiconductor layers 204 include a semiconductor material suitable for use as a nanoribbon such as silicon (Si), SiGe, germanium, or III-V materials like indium phosphide (InP) or gallium arsenide (GaAs). In examples where SiGe is used in each of sacrificial layers 202 and in semiconductor layers 204, the germanium concentration is different between sacrificial layers 202 and semiconductor layers 204. For example, sacrificial layers 202 may include a higher germanium content compared to semiconductor layers 204. In some examples, semiconductor layers 204 may be doped with either n-type dopants (to produce a p-channel transistor) or p-type dopants (to produce an n-channel transistor).

Figure 2B:
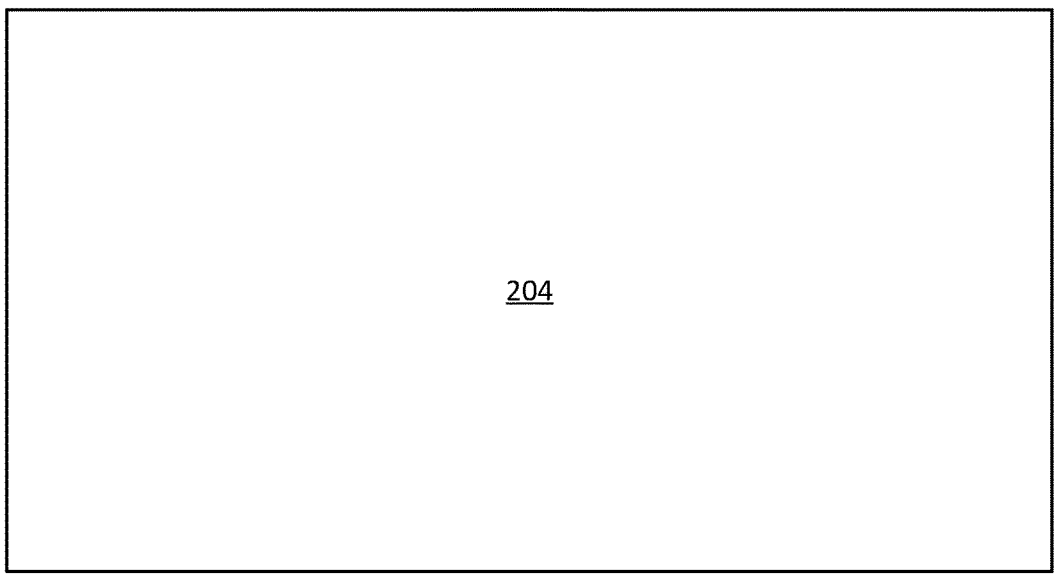

While dimensions can vary from one example embodiment to the next, the thickness of each sacrificial layer 202 may be between about 5 nm and about 20 nm. In some embodiments, the thickness of each sacrificial layer 202 is substantially the same (e.g., within 1-2 nm). The thickness of each of semiconductor layers 204 may be about the same as the thickness of each sacrificial layer 202 (e.g., about 5-20 nm). Each of sacrificial layers 202 and semiconductor layers 204 may be deposited using any known material deposition technique, such as chemical vapor deposition (CVD), plasma-enhanced chemical vapor deposition (PECVD), physical vapor deposition (PVD), or atomic layer deposition (ALD). FIG. 2B illustrates a plan view showing only the top-most deposited semiconductor layer 204, according to an embodiment.

Figure 3A:
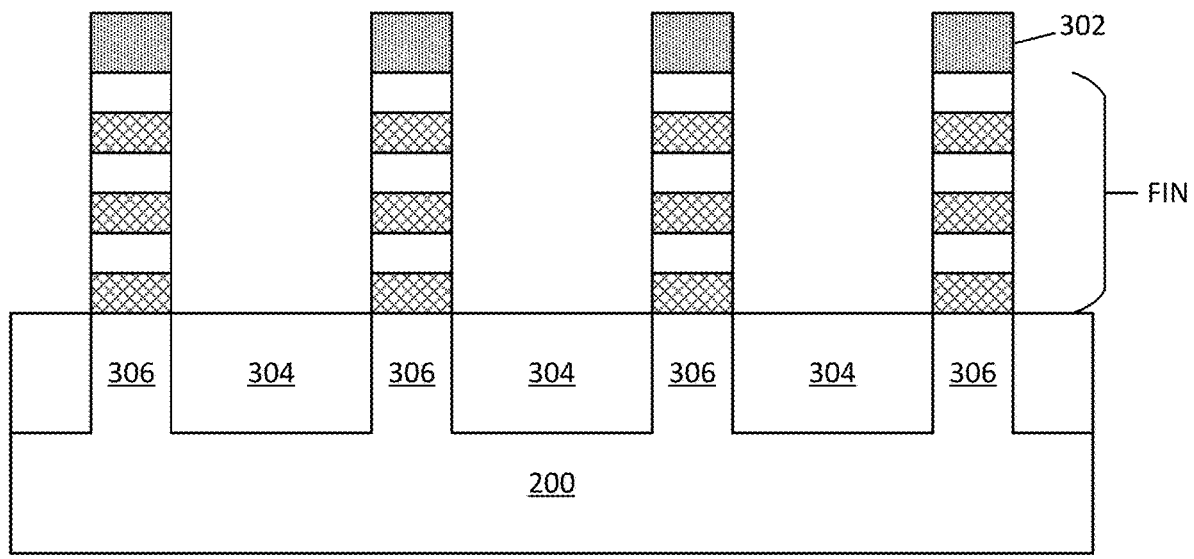
FIGS. 3A and 3B are cross-sectional and plan views, respectively, that illustrate another stage in the example process for forming an integrated circuit configured with self-aligned gate cut structures, in accordance with an embodiment of the present disclosure.
Figure 3B:
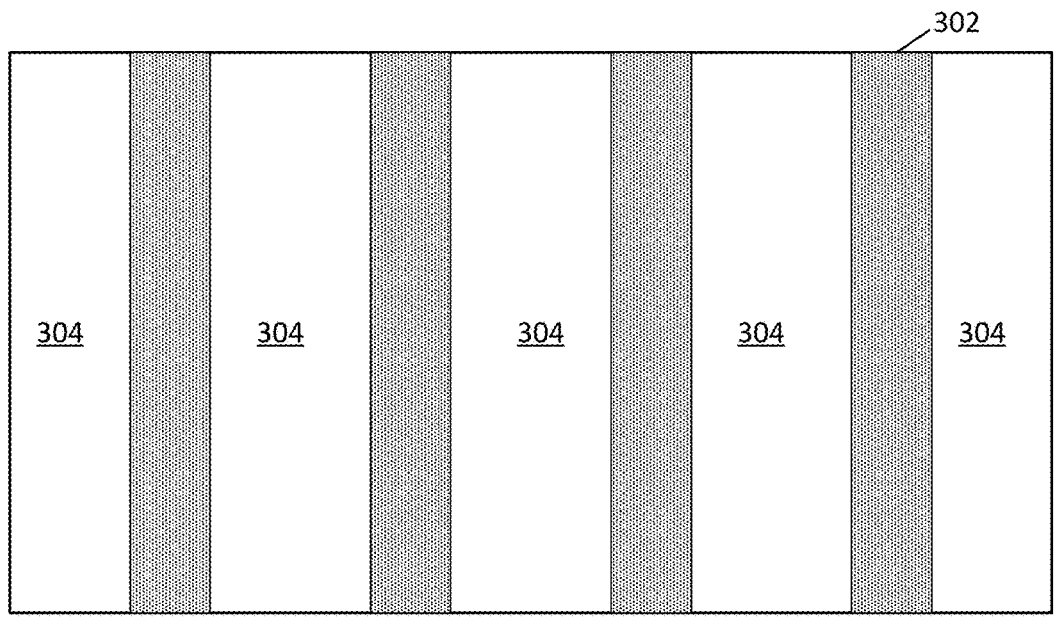

FIGS. 3A and 3B depict the cross-section and plan views of the structure shown in FIGS. 2A and 2B, respectively, following the formation of a cap layer 302 and the subsequent formation of fins beneath cap layer 302, according to an embodiment. Cap layer 302 may be any suitable hard mask material such as a carbon hard mask (CHM) or silicon nitride. Cap layer 302 is patterned into rows to form corresponding rows of fins from the alternating layer stack of sacrificial layers 202 and semiconductor layers 204.

According to some embodiments, an anisotropic etching process through the layer stack continues into at least a portion of substrate 200. The etched portion of substrate 200 may be filled with a dielectric layer 304 that acts as shallow trench isolation (STI) between adjacent fins. Dielectric layer 304 may be any suitable dielectric material such as silicon oxide. Subfin regions 306 represent remaining portions of substrate 200 between dielectric layer 304, according to some embodiments. FIG. 3B illustrates how dielectric layer 304 extends along the entire length of each of the fins, according to some embodiments.

Figure 4A:
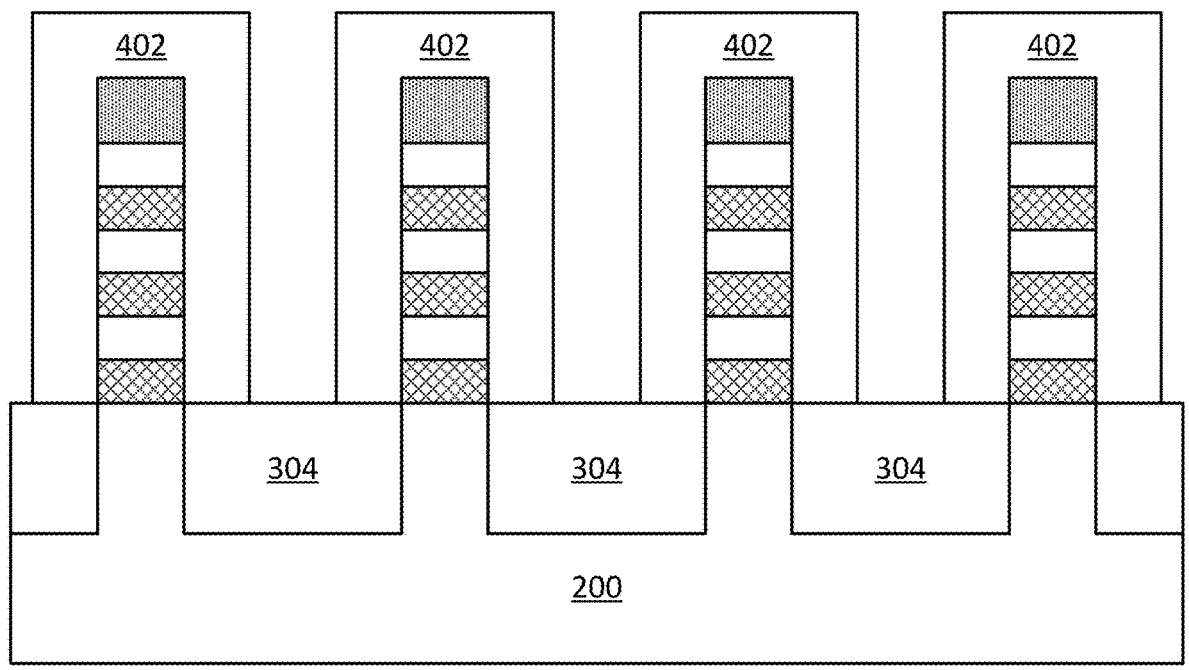
FIGS. 4A and 4B are cross-sectional and plan views, respectively, that illustrate another stage in the example process for forming an integrated circuit configured with self-aligned gate cut structures, in accordance with an embodiment of the present disclosure.
Figure 4B:
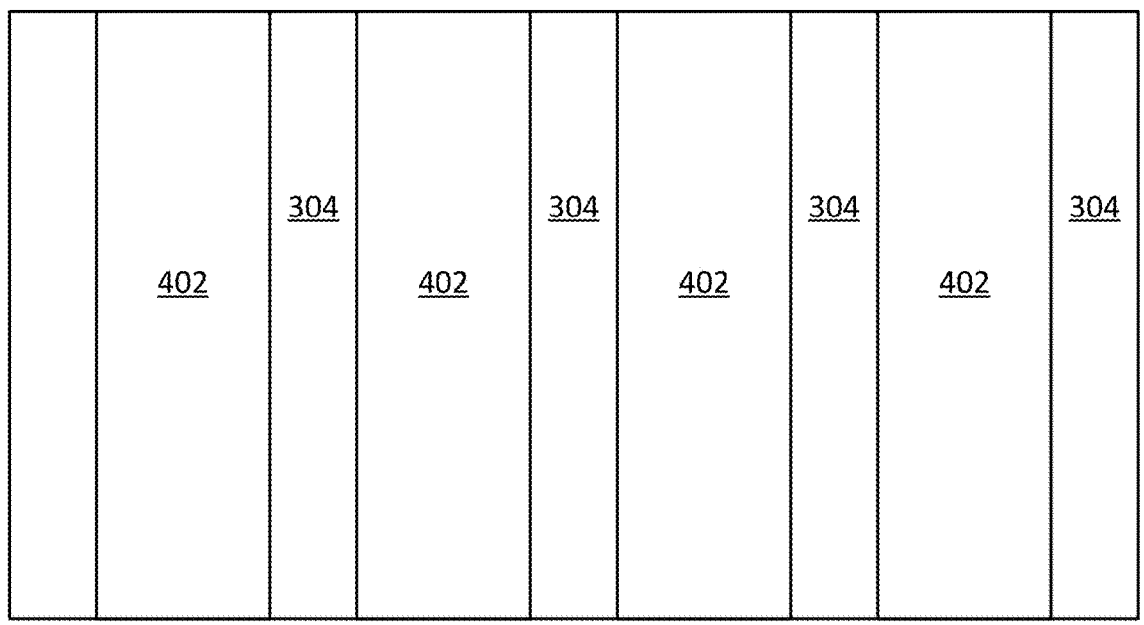

FIGS. 4A and 4B depict the cross-section and plan views of the structure shown in FIGS. 3A and 3B, respectively, following the formation of a spacer structures 402, according to an embodiment. Spacer structures 402 are formed over the sidewalls and top portion of each of the fins. According to some embodiments, spacer structures 402 have a substantially same lateral thickness (e.g., within 1 or 2 nm) on the sidewalls of each of the fins. Although spacer structures 402 are illustrated with angular corners, it should be understood that spacer structures 402 may exhibit rounded or sloped corners due to the deposition process. In some examples, spacer structures 402 are deposited using a PVD process that preferentially deposits along the top and side surfaces while depositing little to no material along the top surface of dielectric layer 304. Spacer structures 402 may be any suitable material exhibiting high etch selectivity with the fin material and dielectric layer 304, such as an amorphous semiconductor material (e.g., amorphous silicon or amorphous germanium), according to some embodiments.

Figure 5A:
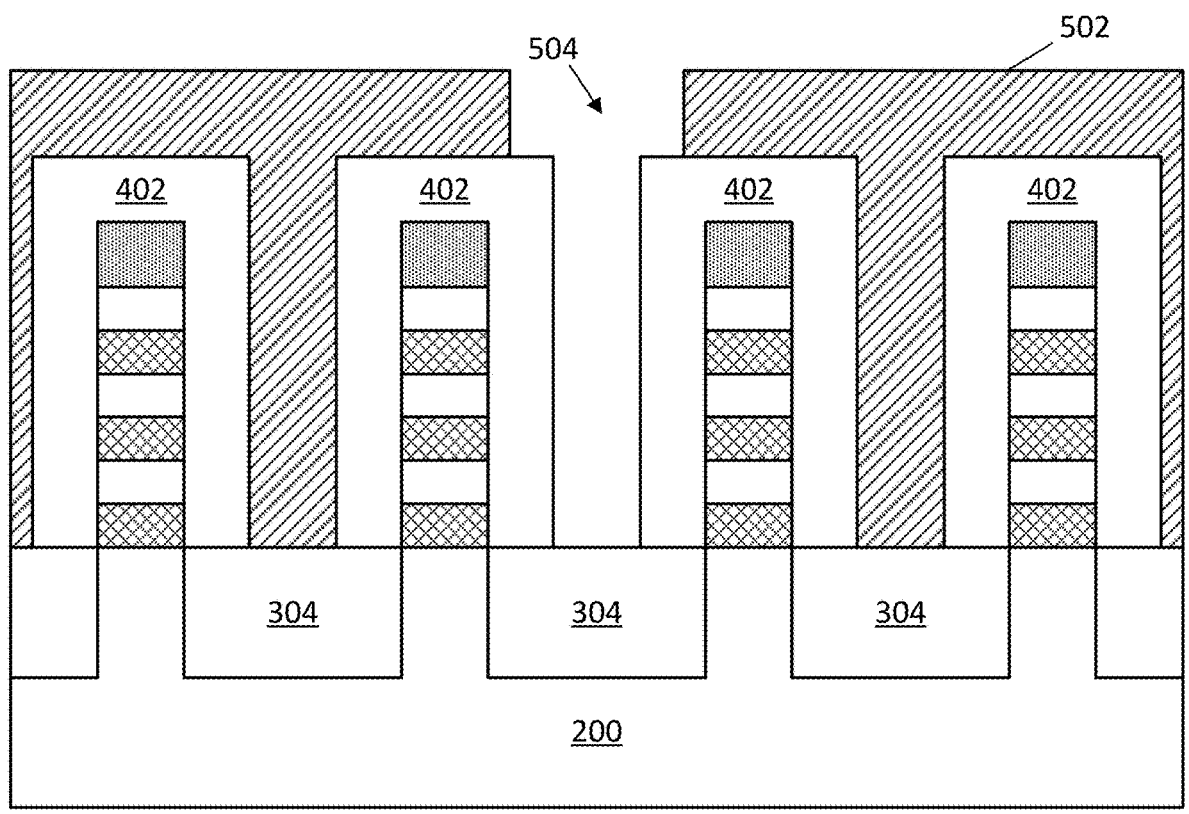
FIGS. 5A and 5B are cross-sectional and plan views, respectively, that illustrate another stage in the example process for forming an integrated circuit configured with self-aligned gate cut structures, in accordance with an embodiment of the present disclosure.
Figure 5B:
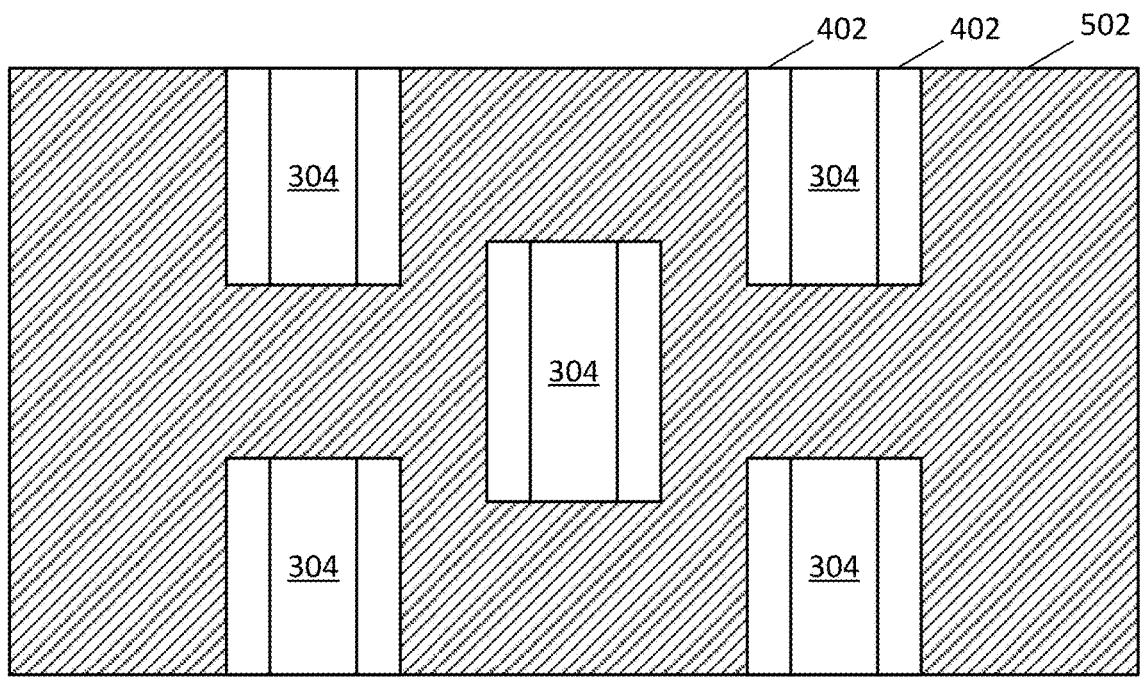

FIGS. 5A and 5B depict the cross-section and plan views of the structure shown in FIGS. 4A and 4B, respectively, following the formation of a sacrificial fill 502, according to some embodiments. Sacrificial fill 502 may be deposited across the entire device such that it fills the regions between spacer structures 402. According to some embodiments, sacrificial fill 502 includes any suitable material exhibiting high etch selectivity with the material chosen for spacer structures 402. For example, sacrificial fill 502 may include any of titanium nitride (TiN), aluminum oxide (AlO2), or tungsten (W), or amorphous silicon (a-Si).

According to some embodiments, portions of sacrificial fill 502 are removed to form one or more recesses 504 between adjacent spacer structures 402. As shown in FIG. 5B, various such recesses may be created at different areas across the device. According to some embodiments, each recess 504 defines a region where a gate cut structure will be formed. Any of recesses 504 may be formed using an isotropic etching process that selectivity removes sacrificial fill 502 while removing very little or none of spacer structures 402. A lithography-based masking process can be used to pattern the recesses. Note the process margin for such patterning is loosened based on the etch selectivity of sacrificial fill 502 with respect to spacer structures 402.

Figure 6A:
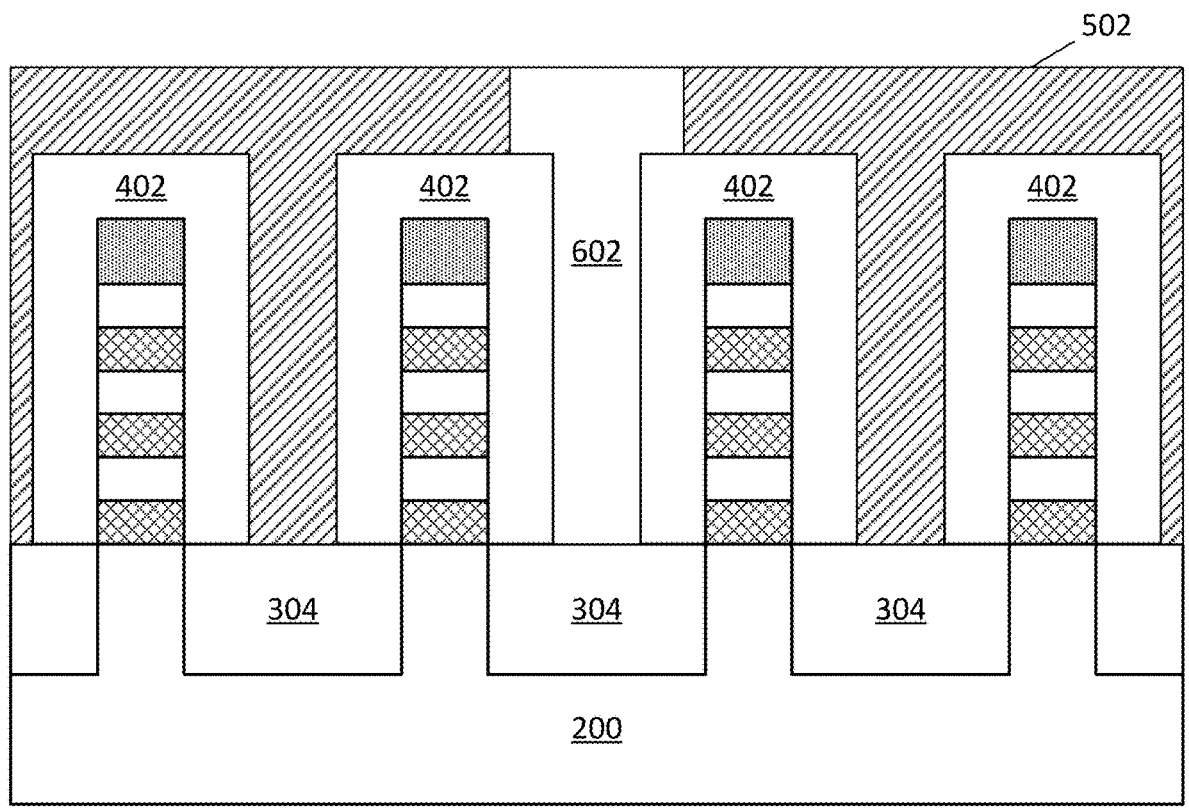
FIGS. 6A and 6B are cross-sectional and plan views, respectively, that illustrate another stage in the example process for forming an integrated circuit configured with self-aligned gate cut structures, in accordance with an embodiment of the present disclosure.
Figure 6B:
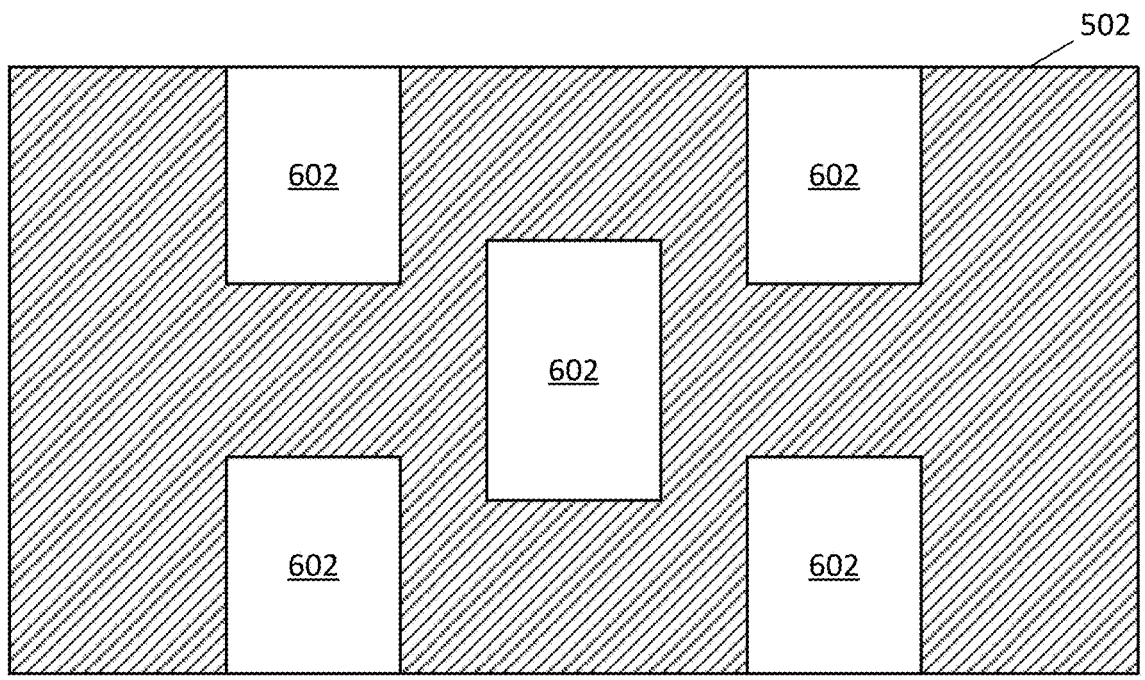

FIGS. 6A and 6B depict the cross-section and plan views of the structure shown in FIGS. 5A and 5B, respectively, following the formation of gate cuts 602, according to some embodiments. Gate cut structures 602 (also referred to more concisely as gate cuts 602) are formed within recesses 504 and are thus self-aligned between adjacent fins. In some embodiments, gate cuts 602 may include a wider top portion that covers a portion of a top surface of spacer structures 402. This wider top portion may be polished away in a subsequent process. Gate cuts 602 may include any suitable dielectric material such as silicon oxide, silicon nitride, or silicon oxynitride. According to some embodiments, gate cuts 602 are formed using a CVD process, such as ALD.

Figure 7A:
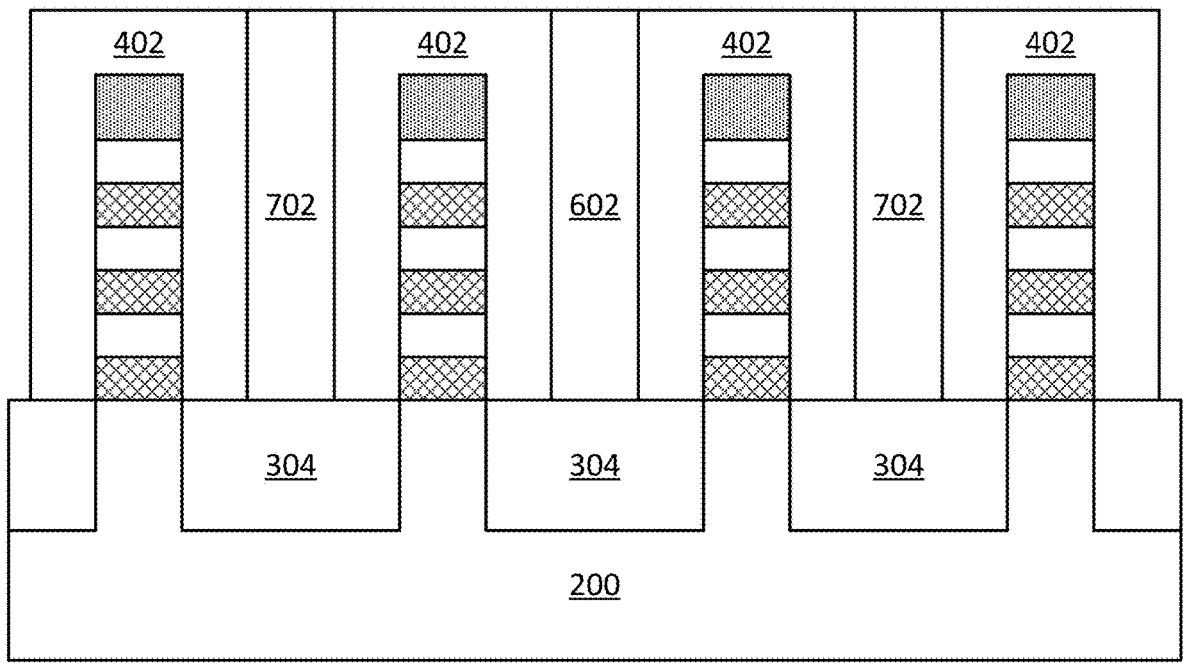
FIGS. 7A and 7B are cross-sectional and plan views, respectively, that illustrate another stage in the example process for forming an integrated circuit configured with self-aligned gate cut structures, in accordance with an embodiment of the present disclosure.
Figure 7B:
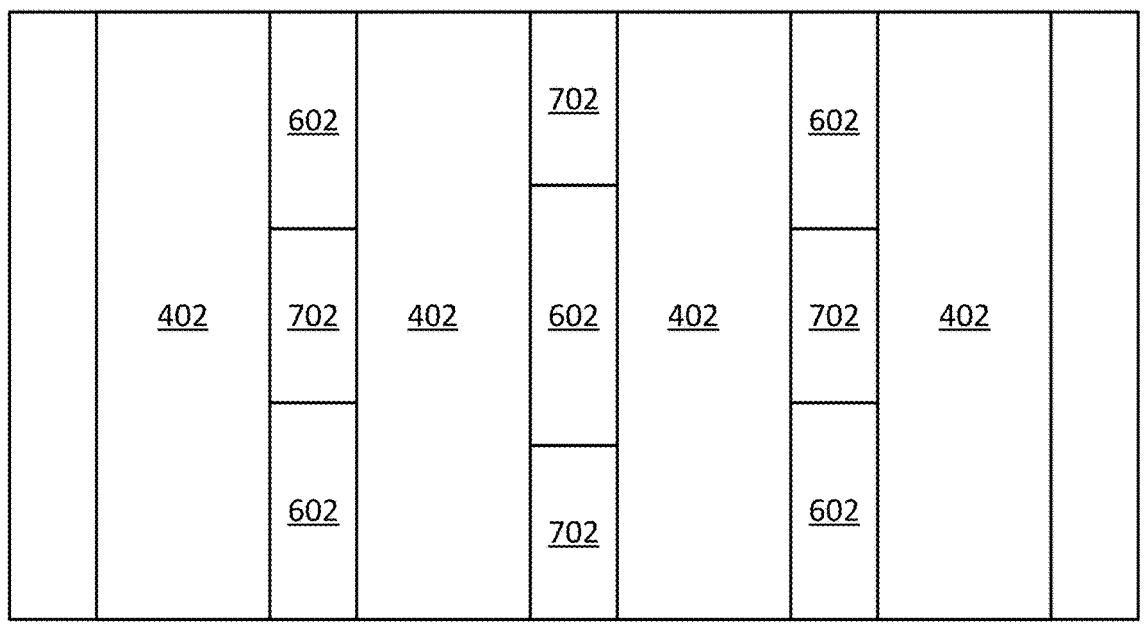

FIGS. 7A and 7B depict the cross-section and plan views of the structure shown in FIGS. 6A and 6B, respectively, following polishing of the device and removal of sacrificial fill 502, according to some embodiments. According to some embodiments, any remaining sacrificial fill 502 is selectively removed and refilled with another fill material 702. Fill material 702 may be the same material as spacer structures 402. Accordingly, fill material 702 may be an amorphous semiconductor material (e.g., amorphous silicon or amorphous germanium), according to some embodiments.

Following the formation of fill material 702, the top of the device may be polished using, for example, chemical mechanical polishing (CMP) to remove any excess gate cut material or fill material 702 present over any portions of spacer structures 402. Accordingly, the planarized structure may include a substantially level top surface across each of gate cuts 602, fill material 702, and spacer structures 402.

Figure 8A:
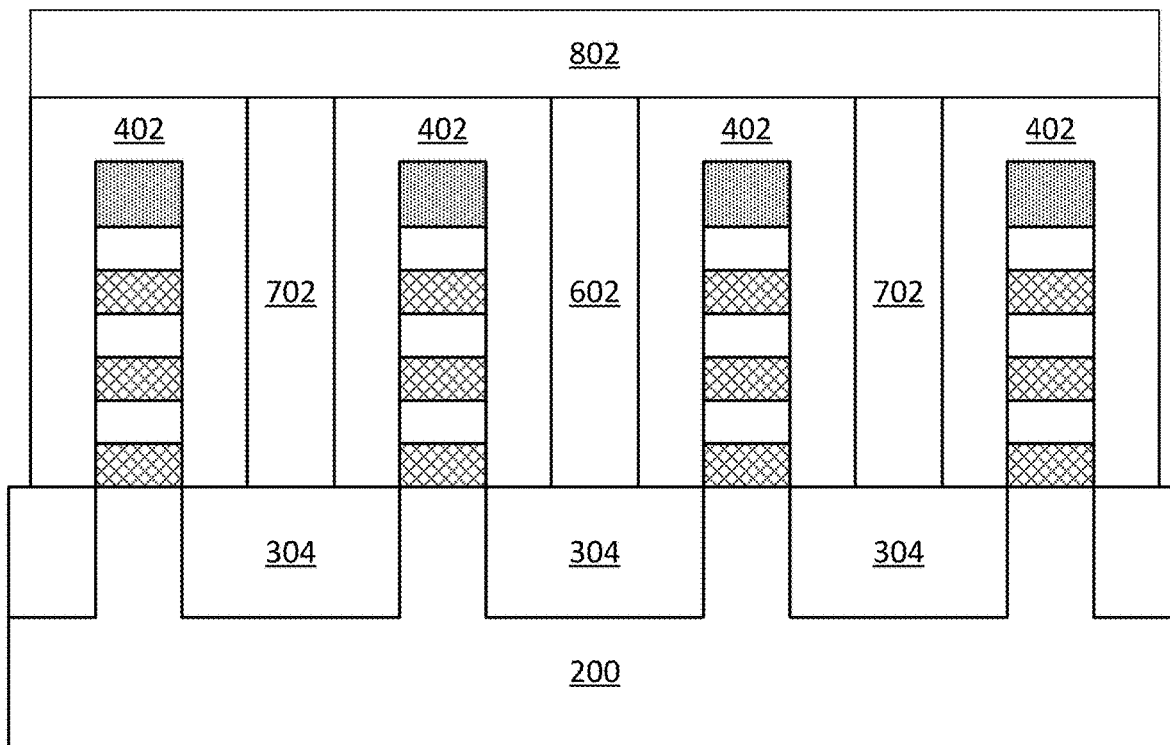
FIGS. 8A and 8B are cross-sectional and plan views, respectively, that illustrate another stage in the example process for forming an integrated circuit configured with self-aligned gate cut structures, in accordance with an embodiment of the present disclosure.
Figure 8B:
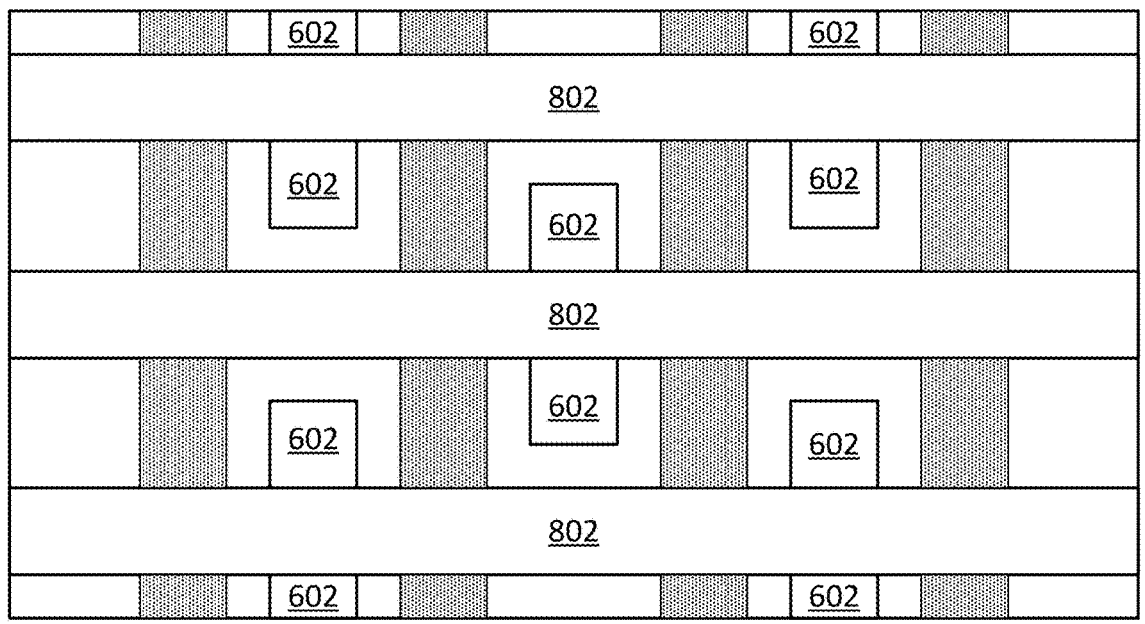

FIGS. 8A and 8B depict the cross-section and plan views of the structure shown in FIGS. 7A and 7B, respectively, following the formation of sacrificial gate lines beneath gate masking layers 802, according to some embodiments. Gate masking layers 802 may be patterned in strips that extend orthogonally across each of the fins. According to some embodiments, spacer structures 402 and fill material 702 are removed in all areas not protected by gate masking layers 802. Accordingly, portions of gate cuts 602 are exposed extending parallel to the fins. Gate masking layers 802 may be any suitable hard mask material such as CHM or silicon nitride.

Figure 9A:
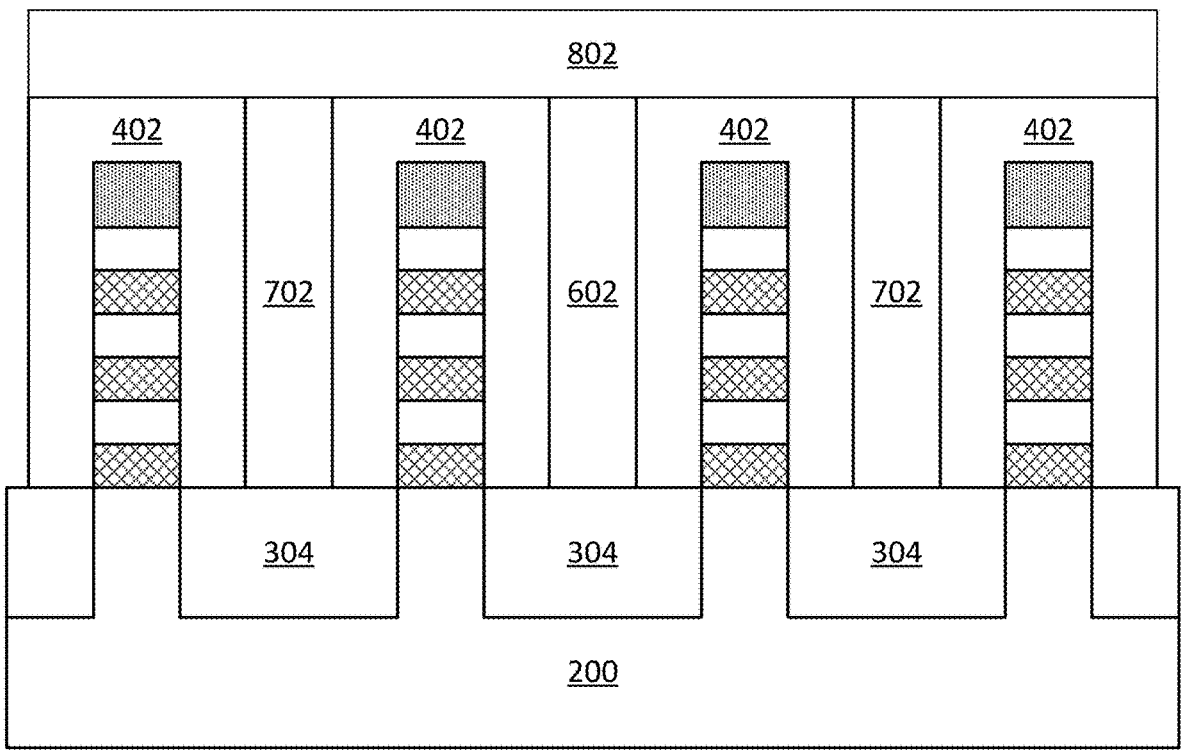
FIGS. 9A and 9B are cross-sectional and plan views, respectively, that illustrate another stage in the example process for forming an integrated circuit configured with self-aligned gate cut structures, in accordance with an embodiment of the present disclosure.
Figure 9B:
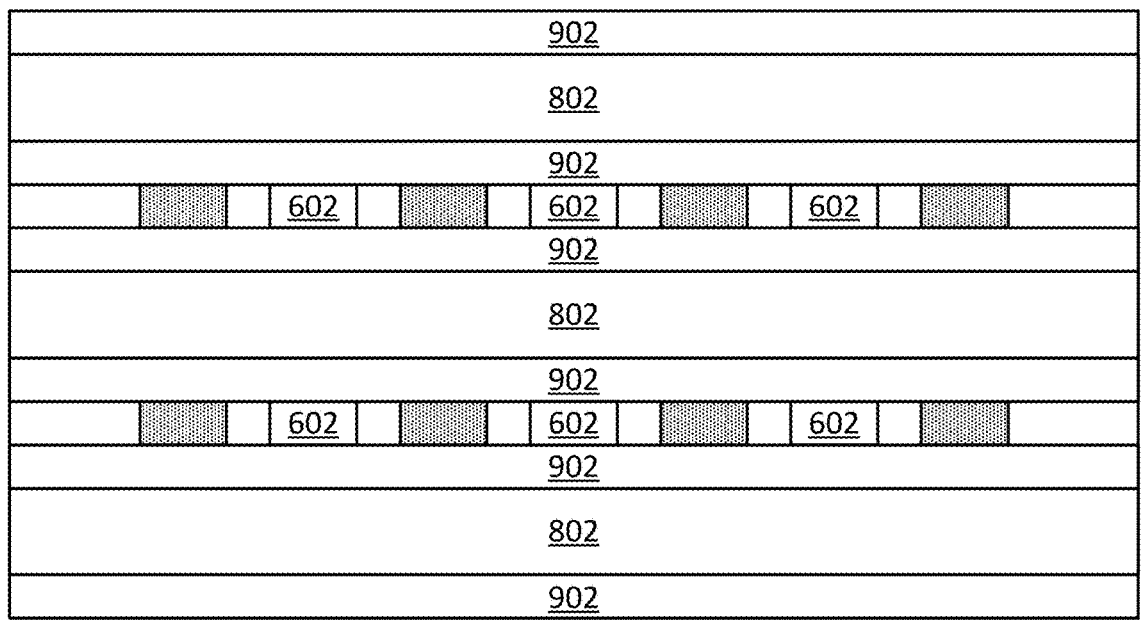

FIGS. 9A and 9B depict the cross-section and plan views of the structure shown in FIGS. 8A and 8B, respectively, following the formation of sidewall spacers 902, according to some embodiments. Sidewall spacers 902 may be formed along the sidewalls of gate masking layers 802 and the underlying materials beneath gate masking layers 802. Accordingly, sidewall spacers 902 extend over the top surfaces of gate cuts 602 such that gate cuts 602 extend through sidewall spacers 902. Sidewall spacers 902 may be deposited and then etched back such that sidewall spacers 902 remain mostly only on sidewalls of any exposed structures. In the plan view of FIG. 8B, the top surface of gate cuts 602 can be seen only in areas not covered by either sidewall spacers 902 or gate masking layers 802.

Figure 10A:
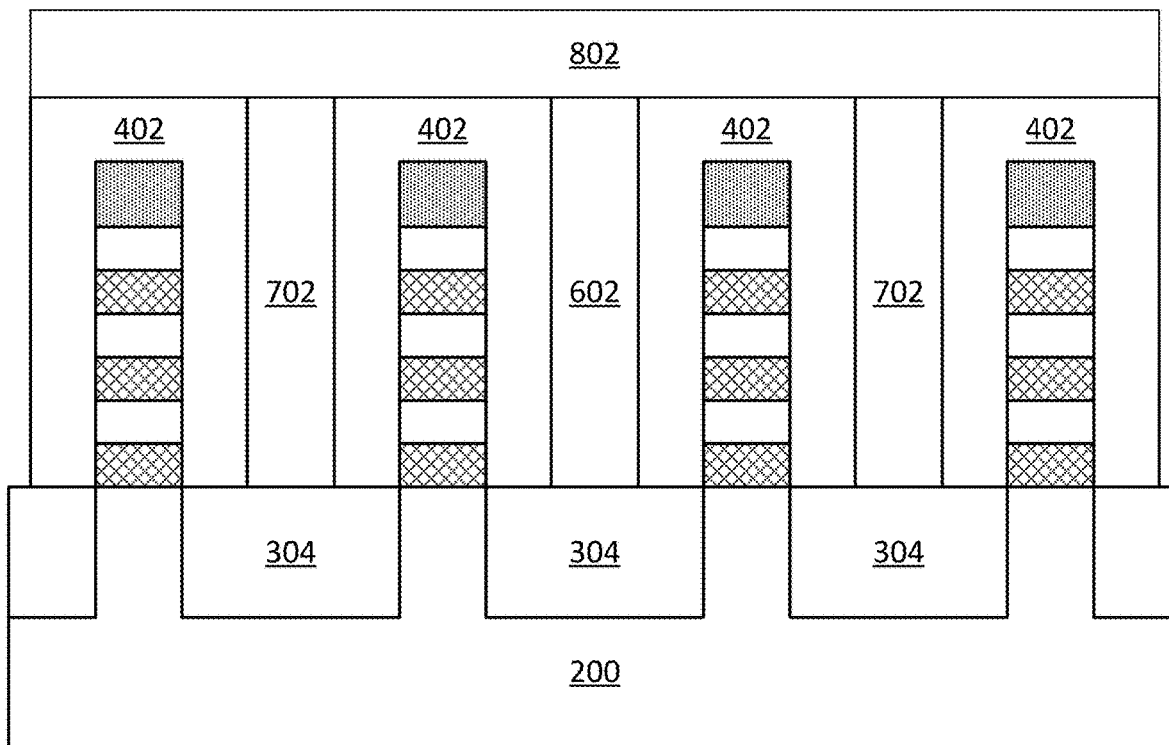
FIGS. 10A and 10B are cross-sectional and plan views, respectively, that illustrate another stage in the example process for forming an integrated circuit configured with self-aligned gate cut structures, in accordance with an embodiment of the present disclosure.
Figure 10B:
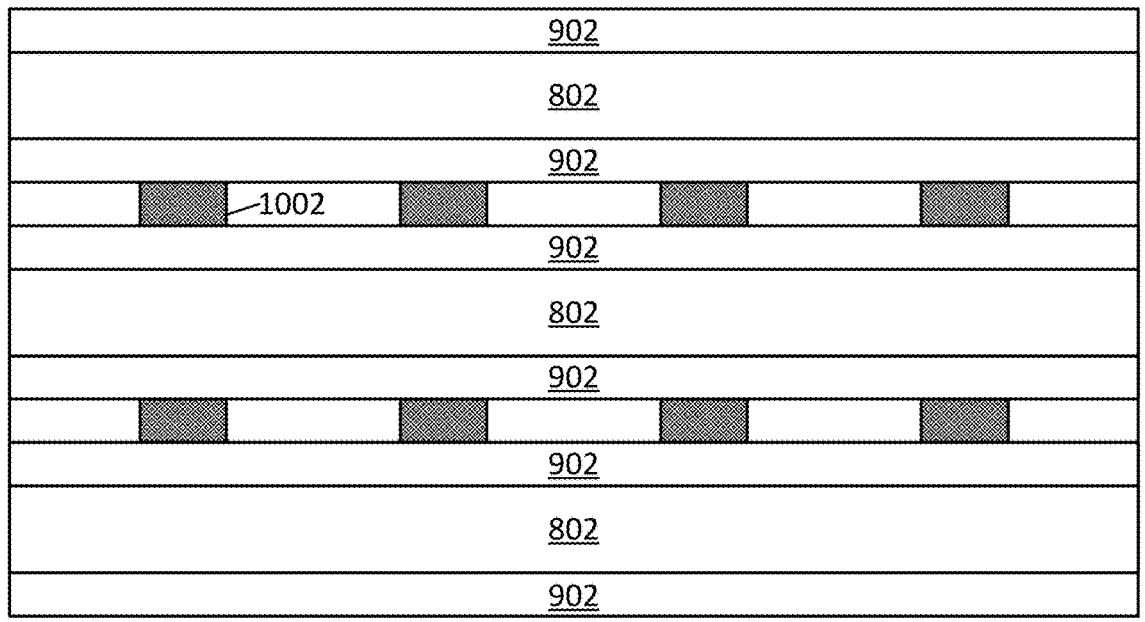

FIGS. 10A and 10B depict the cross-section and plan views of the structure shown in FIGS. 9A and 9B, respectively, following the formation of source or drain regions 1002, according to some embodiments. Exposed portions of the fins (along with cap layer 302) between sidewall spacers 902 are removed. According to some embodiments, any exposed portions of gate cuts 602 between sidewall spacers 902 are also removed.

Once the exposed fins have been removed, source or drain regions 1002 may be formed in the areas that had been previously occupied by the exposed fins between sidewall spacers 902. According to some embodiments, source or drain regions 1002 are epitaxially grown from the exposed semiconductor material of the fins along the exterior walls of sidewall spacers 902. In some example embodiments, source or drain regions 1002 are NMOS source or drain regions (e.g., epitaxial silicon) or PMOS source or drain regions (e.g., epitaxial SiGe).

Figure 11A:
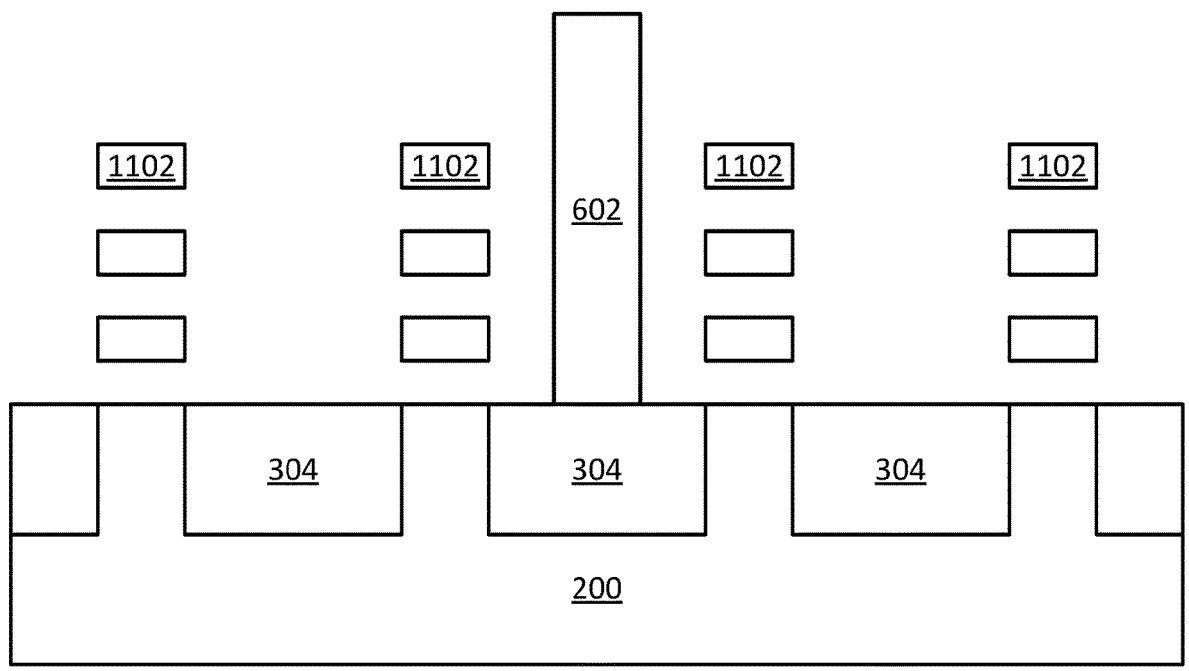
FIGS. 11A and 11B are cross-sectional and plan views, respectively, that illustrate another stage in the example process for forming an integrated circuit configured with self-aligned gate cut structures, in accordance with an embodiment of the present disclosure.
Figure 11B:
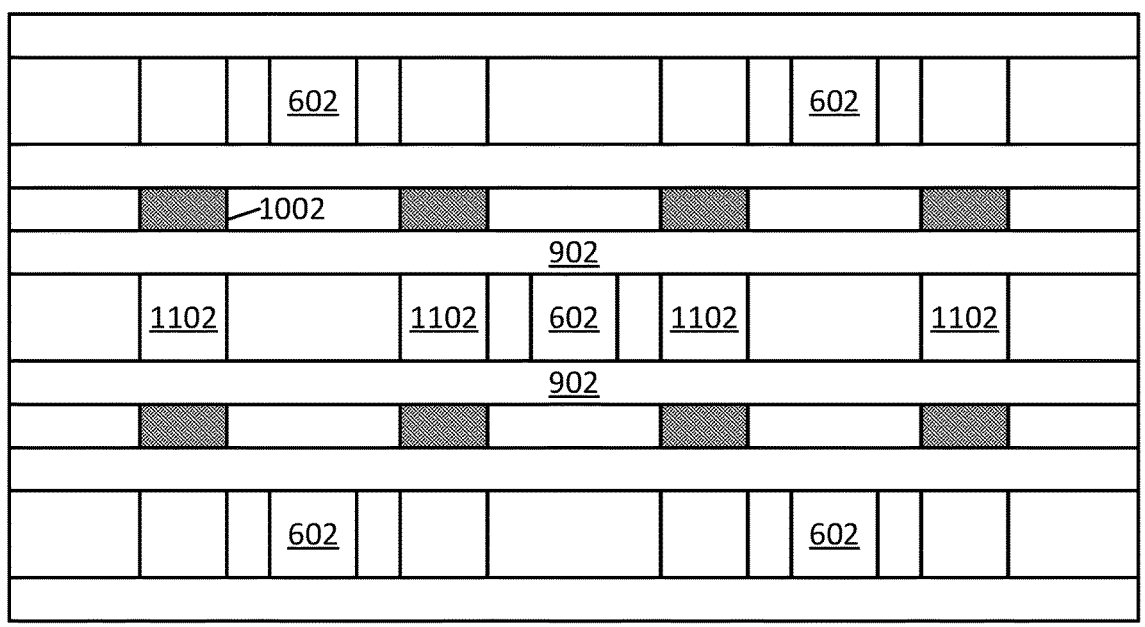

FIGS. 11A and 11B depict the cross-section and plan views of the structure shown in FIGS. 10A and 10B, respectively, following the removal of gate masking layers 802 and several of the other underlying materials, according to some embodiments. Once gate masking layers 802 are removed, the underlying sacrificial gate materials made up of spacer structures 402 and fill material 702 is also removed thus exposing each of the fins extending between sidewall spacers 902. An isotropic etching process may be performed to selectively remove both spacer structures 402 and fill material 702 without damaging the semiconductor material of the fins. According to some embodiments, gate cuts 602 are not removed during this process and remain within the trench between sidewall spacers 902 and extending parallel to the fins.

In the example where the fins include alternating semiconductor layers, sacrificial layers 202 are selectively removed to leave behind nanoribbons 1102 that extend between source or drain regions 1002. Each vertical set of nanoribbons 1102 represents a single semiconductor device. According to some embodiments, gate cuts 602 extend higher than a top nanoribbon 1102 of each of the semiconductor devices. In some embodiments, cap layer 302 is also removed from above each of the fins, although in some other embodiments cap layer 302 is removed earlier in the process or may remain in the final device.

Figure 12A:
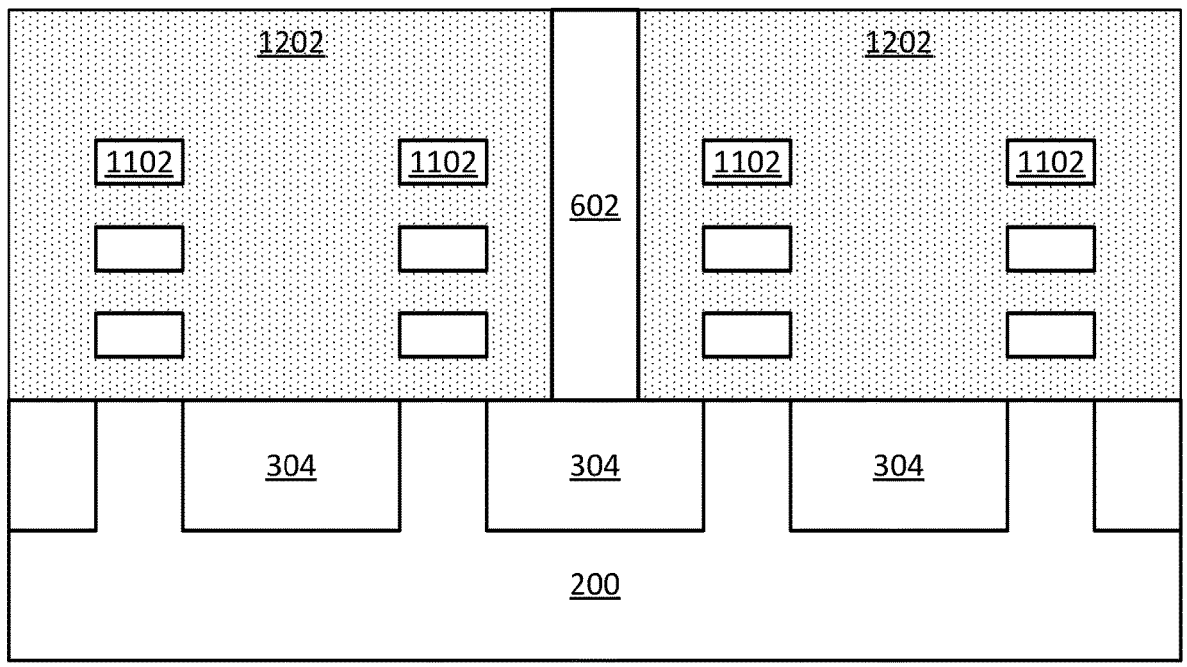
FIGS. 12A and 12B are cross-sectional and plan views, respectively, that illustrate another stage in the example process for forming an integrated circuit configured with self-aligned gate cut structures, in accordance with an embodiment of the present disclosure.
Figure 12B:
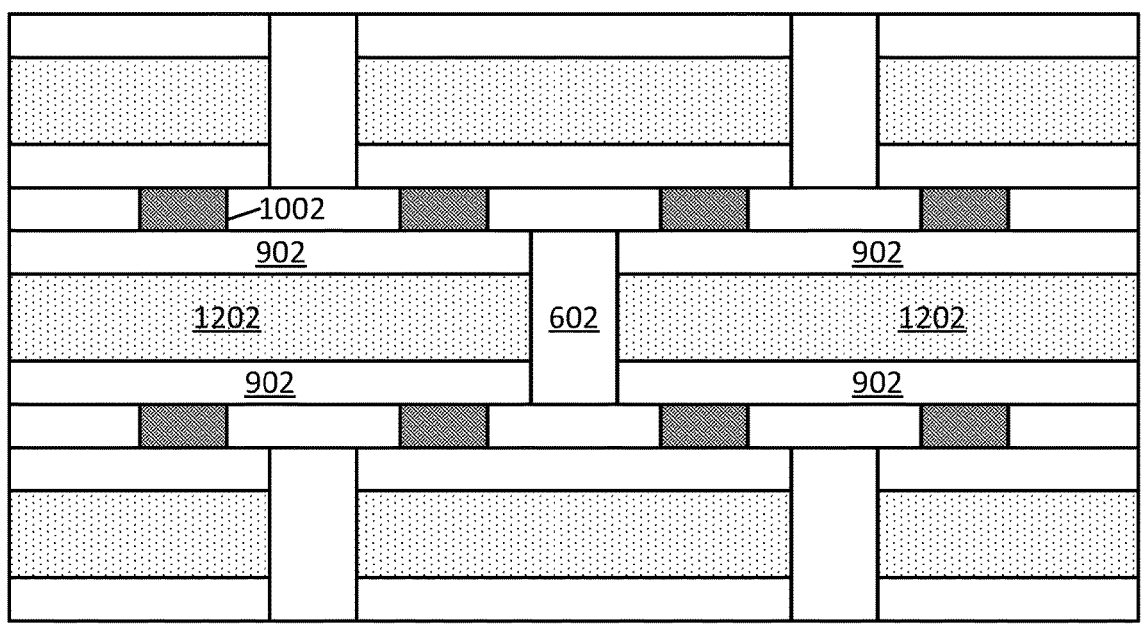

FIGS. 12A and 12B depict the cross-section and plan views of the structure shown in FIGS. 11A and 11B, respectively, following the formation of gate structure 1202 and subsequent polishing, according to some embodiments. As noted above, one or more gate dielectric layers may be first formed around nanoribbons 1102 prior to the formation of one or more conductive layers, all of which are part of gate structure 1202. The one or more gate dielectric layers may include any suitable dielectric material (such as silicon dioxide, and/or a high-k dielectric material). Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. According to some embodiments, the one or more gate dielectric layers includes a layer of hafnium oxide with a thickness between about 1 nm and about 5 nm. In some embodiments, the one or more gate dielectric layers may include one or more silicates (e.g., titanium silicate, tungsten silicate, niobium silicate, and silicates of other transition metals). One or more gate dielectric layers may include a first layer on nanoribbons 1102, and a second layer on the first layer. The first layer can be, for instance, an oxide of the semiconductor material of nanoribbons 1102 (e.g., silicon dioxide) and the second layer can be a high-k dielectric material (e.g., hafnium oxide).

Gate structure 1202 can be any standard or proprietary gate structure. The conductive layers of gate structure 1202 (referred to herein as a gate electrode) may be deposited using electroplating, electroless plating, CVD, PECVD, ALD, or PVD, to name a few examples. In some embodiments, the gate electrode includes doped polysilicon, a metal, or a metal alloy. Example suitable metals or metal alloys include aluminum, tungsten, cobalt, molybdenum, ruthenium, titanium, tantalum, copper, and carbides and nitrides thereof. The gate electrode may include, for instance, a metal fill material along with one or more workfunction layers, resistance-reducing layers, and/or barrier layers. The workfunction layers can include, for example, p-type workfunction materials (e.g., titanium nitride) for PMOS gates, or n-type workfunction materials (e.g., titanium aluminum carbide) for NMOS gates.

According to some embodiments, each gate structure 1202 runs orthogonally over a plurality of parallel fins or nanoribbons such that it extends over the semiconductor regions of a plurality of different semiconductor devices. Following the formation of gate structure 1202, the entire structure may be polished to ensure that gate cut 602 fully interrupts gate structure 1202 along its length. According to some embodiments, the polishing also removes any portion of sidewall spacers 902 over the top surface of gate cuts 602, thus exposing gate cuts 602 interrupting sidewall spacers 902 along their length.

As noted above, due to use of spacer structures 402 during the fabrication process, gate cuts 602 are self-aligned at the midpoint between adjacent semiconductor devices. Also, since the size of a given gate cut is determined by the original distance between the adjacent semiconductor structures, gate cuts of different sizes (e.g., different widths) can be formed across the integrated circuit in a single patterning step.

Figure 13:
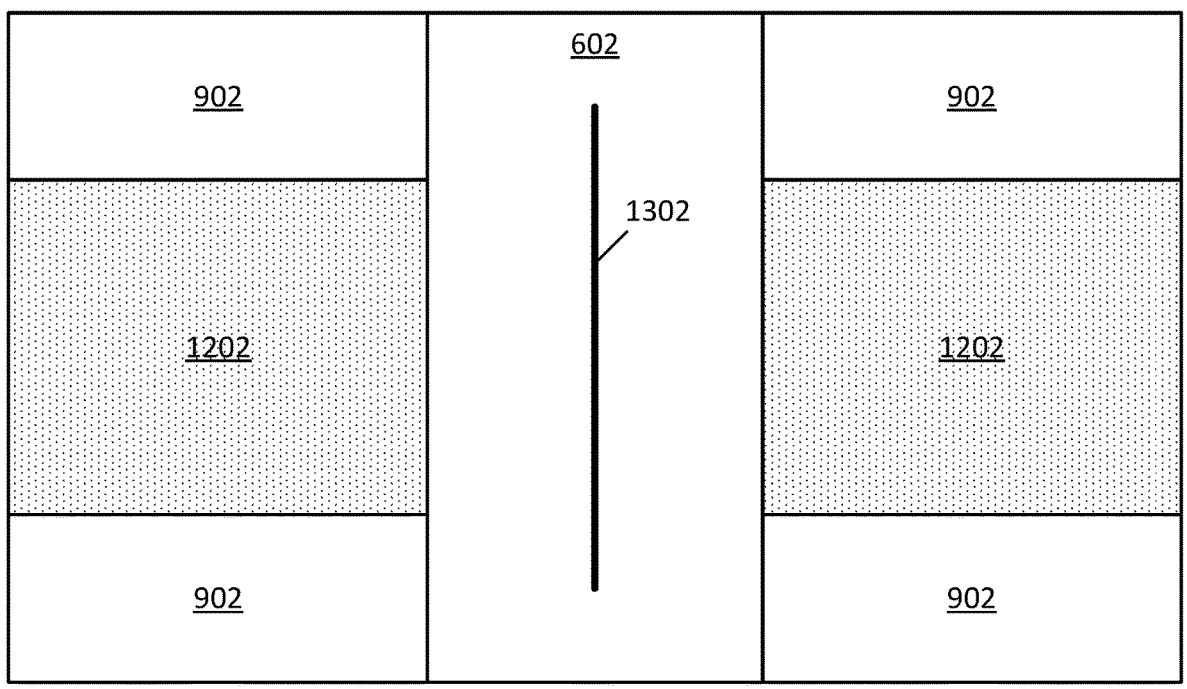
FIG. 13 is a plan view of an example gate structure showing a seam on the gate cut structure, in accordance with an embodiment of the present disclosure.

FIG. 13 illustrates a plan view of a zoomed-in portion of the integrated circuit where gate cut 602 extends across gate structure 1202 and sidewall spacers 902. According to some embodiments, gate cut 602 is formed using a layer-by-layer deposition process, such as ALD, which forms gate cut 602 inwards from the outer edges of the recess and thus forms a seam 1302 along a middle portion of gate cut 602. In some examples, seam 1302 runs along the length of gate cut 602 substantially parallel to the lengths of nanoribbons 1102. Due to the formation of gate cut 602 prior to the formation of sidewall spacers 902, seam 1302 exhibits a length that is the same as or longer than the total width of gate structure 1202. The location of the ends of seam 1302 may vary depending on the alignment of gate cut 602 during its formation, but in some examples one or both ends of seam 1302 will fall along the length of sidewall spacers 902. Such a seam can result, for example, when opposing deposition surfaces meet to interface with one another. The seam may be detectable, for example, via SEM imaging.

Figure 14:
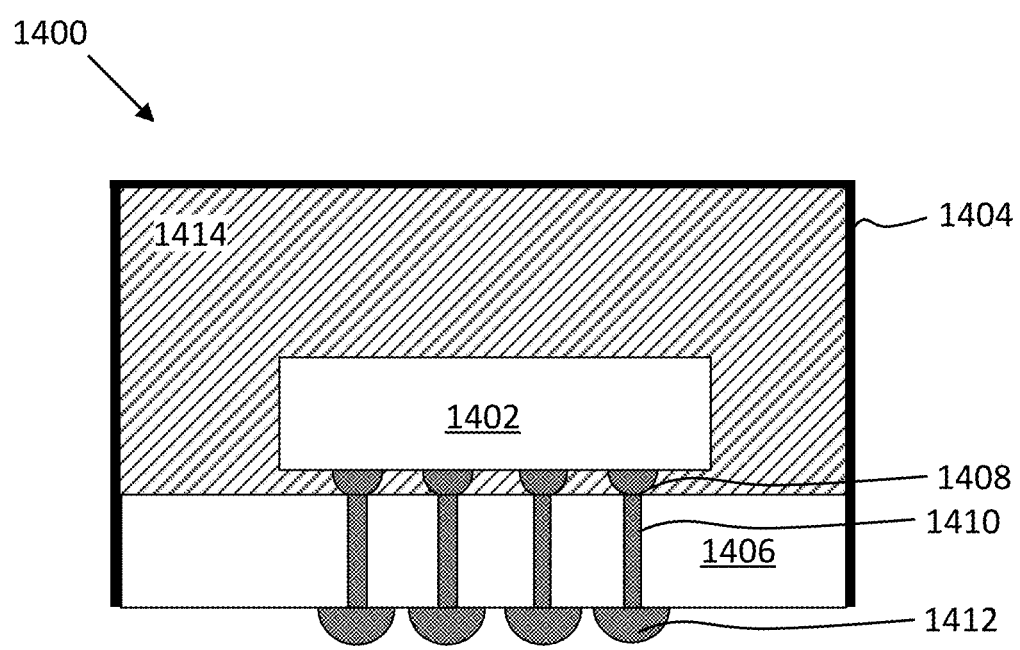
FIG. 14 illustrates a cross-section view of a chip package containing one or more semiconductor dies, in accordance with some embodiments of the present disclosure.

FIG. 14 illustrates an example embodiment of a chip package 1400, in accordance with an embodiment of the present disclosure. As can be seen, chip package 1400 includes one or more dies 1402. One or more dies 1402 may include at least one integrated circuit having semiconductor devices, such as any of the semiconductor devices disclosed herein. One or more dies 1402 may include any other circuitry used to interface with other devices formed on the dies, or other devices connected to chip package 1400, in some example configurations.

As can be further seen, chip package 1400 includes a housing 1404 that is bonded to a package substrate 1406. The housing 1404 may be any standard or proprietary housing, and may provide, for example, electromagnetic shielding and environmental protection for the components of chip package 1400. The one or more dies 1402 may be conductively coupled to a package substrate 1406 using connections 1408, which may be implemented with any number of standard or proprietary connection mechanisms, such as solder bumps, ball grid array (BGA), pins, or wire bonds, to name a few examples. Package substrate 1406 may be any standard or proprietary package substrate, but in some cases includes a dielectric material having conductive pathways (e.g., including conductive vias and lines) extending through the dielectric material between the faces of package substrate 1406, or between different locations on each face. In some embodiments, package substrate 1406 may have a thickness less than 1 millimeter (e.g., between 0.1 millimeters and 0.5 millimeters), although any number of package geometries can be used. Additional conductive contacts 1412 may be disposed at an opposite face of package substrate 1406 for conductively contacting, for instance, a printed circuit board (PCB). One or more vias 1410 extend through a thickness of package substrate 1406 to provide conductive pathways between one or more of connections 1408 to one or more of contacts 1412. Vias 1410 are illustrated as single straight columns through package substrate 1406 for ease of illustration, although other configurations can be used (e.g., damascene, dual damascene, through-silicon via, or an interconnect structure that meanders through the thickness of substrate 1406 to contact one or more intermediate locations therein). In still other embodiments, vias 1410 are fabricated by multiple smaller stacked vias, or are staggered at different locations across package substrate 1406. In the illustrated embodiment, contacts 1412 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 1412, to inhibit shorting.

In some embodiments, a mold material 1414 may be disposed around the one or more dies 1402 included within housing 1404 (e.g., between dies 1402 and package substrate 1406 as an underfill material, as well as between dies 1402 and housing 1404 as an overfill material). Although the dimensions and qualities of the mold material 1414 can vary from one embodiment to the next, in some embodiments, a thickness of mold material 1414 is less than 1 millimeter. Example materials that may be used for mold material 1414 include epoxy mold materials, as suitable. In some cases, the mold material 1414 is thermally conductive, in addition to being electrically insulating.

Methodology

Figure 15:
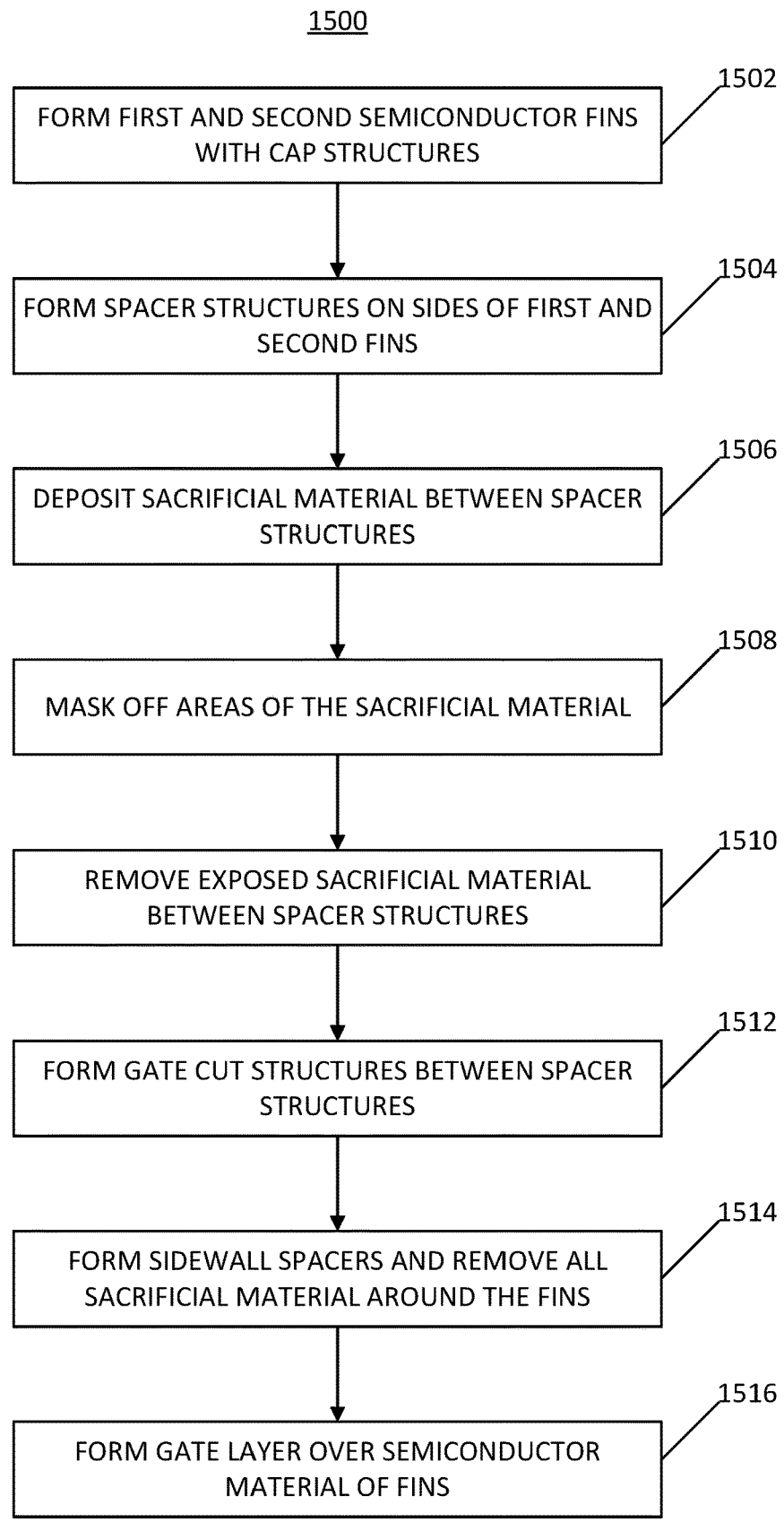
FIG. 15 is a flowchart of a fabrication process for a semiconductor device having self-aligned gate cut structures, in accordance with an embodiment of the present disclosure.

FIG. 15 is a flow chart of a method 1500 for forming at least a portion of an integrated circuit, according to an embodiment. Various operations of method 1500 may be illustrated in FIGS. 2A-12A and 2B-12B. However, the correlation of the various operations of method 1500 to the specific components illustrated in the aforementioned figures is not intended to imply any structural and/or use limitations. Rather, the aforementioned figures provide one example embodiment of method 1500. Other operations may be performed before, during, or after any of the operations of method 1500. For example, method 1500 does not explicitly describe many steps that are performed to form common transistor structures. Some of the operations of method 1500 may be performed in a different order than the illustrated order.

Method 1500 begins with operation 1502 where at least first and second parallel semiconductor fins are formed, according to some embodiments. The semiconductor material in the fins may be formed from a substrate such that the fins are an integral part of the substrate (e.g., etched from a bulk silicon substrate). Alternatively, the fins can be formed of material deposited onto an underlying substrate. In one such example case, a blanket layer of silicon germanium (SiGe) can be deposited onto a silicon substrate, and then patterned and etched to form a plurality of SiGe fins extending from that substrate. In another such example, non-native fins can be formed in a so-called aspect ratio trapping based process, where native fins are etched away so as to leave fin-shaped trenches which can then be filled with an alternative semiconductor material (e.g., group IV or III-V material). In still other embodiments, the fins include alternating layers of material (e.g., alternating layers of silicon and SiGe) that facilitates forming of nanowires and nanoribbons during a gate forming process where one type of the alternating layers are selectively etched away so as to liberate the other type of alternating layers within the channel region, so that a gate-all-around (GAA) process can then be carried out. Again, the alternating layers can be blanket deposited and then etched into fins, or deposited into fin-shaped trenches. The fins also include a cap structure over each fin that is used to define the locations of the fins during, for example, an RIE process. The cap structure may be a dielectric material, such as silicon nitride.

Method 1500 continues with operation 1504 where spacer structures are formed on sidewall portions of at least the first and second fins, according to some embodiments. The spacer structures may also be formed along sidewall portions of the cap structures on the fins. The spacer structures may be formed preferentially over the sidewall and top surfaces of the fins using, for example, a PVD process. Unlike typical gate spacers, these spacer structures include an amorphous semiconductor material, such as amorphous silicon (a-Si) or amorphous germanium (a-Ge), according to some embodiments.

Method 1500 continues with operation 1506 where a sacrificial material is deposited between adjacent spacer structures from adjacent fins (such as first and second fins), according to some embodiments. The sacrificial material may be another semiconductor material that is different from the semiconductor material of the spacer structures such that there can be sufficient etch selectivity between the sacrificial material and the spacer structures. In some examples, the sacrificial material is amorphous silicon germanium (a-SiGe) while the spacer structures are amorphous silicon (a-Si). In some other examples, both the sacrificial material and the spacer structures include a-SiGe but with different germanium concentrations such that sufficient etch selectivity can be achieved between the two materials. In yet other examples the sacrificial material includes any of titanium nitride (TiN), aluminum oxide (AlO2), or tungsten (W). The sacrificial material may be deposited using any conventional deposition technique, such as CVD, plasma-enhanced chemical vapor deposition (PECVD), Atomic Layer Deposition (ALD) or physical vapor deposition (PVD) followed by a polishing process (e.g., using CMP) to planarize the top surface of the sacrificial material.

Method 1500 continues with operation 1508 where areas of the sacrificial material are masked using a hard mask material or a photoresist, according to some embodiments. Standard lithography techniques may be employed to expose certain regions of the sacrificial material while masking others. According to some embodiments, the exposed regions of sacrificial material mark where gate cuts will be formed.

Method 1500 continues with operation 1510 where the exposed regions of sacrificial material are removed from between adjacent fins (such as an exposed region between the first and second semiconductor fins), according to some embodiments. The removed sacrificial material forms self-aligned recesses between adjacent spacer structures that will be later filled to form the gate cuts. Accordingly, the sacrificial material is removed only in areas where gate cuts are desired. An isotropic etching process may be used to selectively remove the sacrificial material while removing little to none of the adjacent spacer structures.

Method 1500 continues with operation 1512 where gate cut structures are formed in the recesses created by the removal of the sacrificial material, according to some embodiments. The gate cut structures will ultimately act as the gate cuts after deposition of the gate layer. In some embodiments, the gate cut structures include silicon nitride or some other semiconductor nitride. Due to the formation of the spacer structures of substantially equal width, the gate cut structures will be self-aligned between adjacent fins without the need for any lithography-based alignment.

Method 1500 continues with operation 1514 where sidewall spacers are formed running orthogonal to the lengths of the fins, and any sacrificial material around the fins between the sidewall spacers is removed, according to some embodiments. The sidewall spacers may be formed along the side surfaces of gate masking layers and the sacrificial gate traces made up of sacrificial spacer structure material between the fins beneath the gate masking layers. Once sidewall spacers have been formed, various sacrificial layers around the fins including the gate masking layers and spacer structures can be removed from between the sidewall spacers. After the removal of the sacrificial layers, the semiconductor fins and gate cuts are left extending between the sidewall spacers. According to some embodiments, the fins extend through the sidewall spacers between source or drain regions on either ends of the fins. Due to the timing of the formation of the gate cuts, they will also extend through the sidewall spacers, according to some embodiments. In the example case where GAA transistors are used, any sacrificial layers within the exposed fins between the sidewall spacers are removed to leave behind nanoribbons of semiconductor material.

Method 1500 continues with operation 1516 where a gate layer is formed over at least the semiconductor material of the first and second fins, according to some embodiments. In the example case of GAA transistors, the gate layer is formed over the semiconductor nanoribbons that extend between the sidewall spacers. The gate layer will be interrupted by the presence of any gate cuts formed during operation 1510, thus isolating the gates of semiconductor devices on either side of the gate cuts. In one example where a gate cut is formed between the first and second fins, semiconductor devices formed from the first and second fins will have their gates isolated from one another due to the gate cut interrupting the gate layer across the first and second fins. The gate layer can include any conductive material, such as a metal, metal alloy, or polysilicon. The gate layer may be deposited using electroplating, electroless plating, CVD, ALD, PECVD, or PVD, to name a few examples.

Example System

Figure 16:
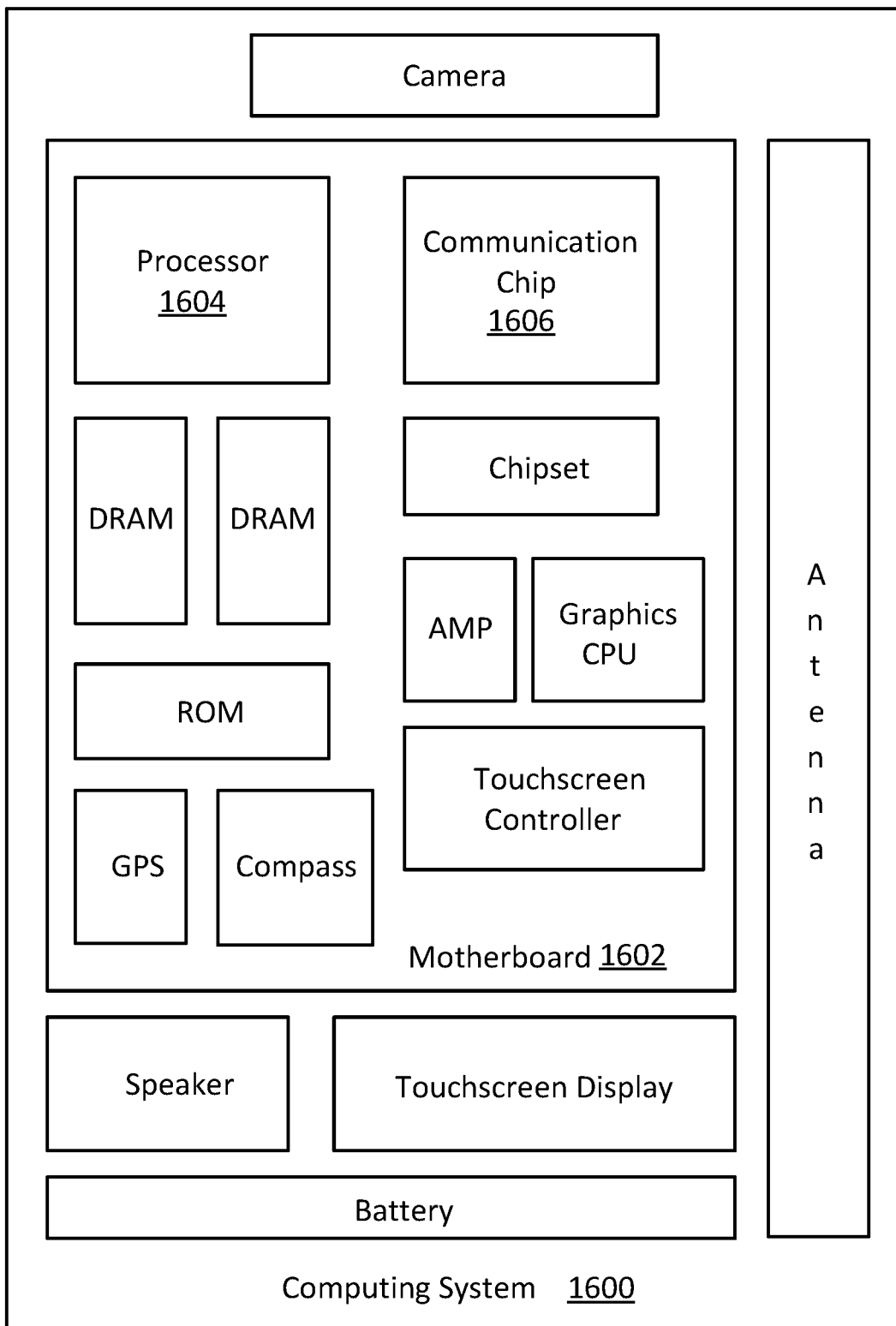
FIG. 16 illustrates a computing system including one or more integrated circuits, as variously described herein, in accordance with an embodiment of the present disclosure.

FIG. 16 is an example computing system implemented with one or more of the integrated circuit structures as disclosed herein, in accordance with some embodiments of the present disclosure. As can be seen, the computing system 1600 houses a motherboard 1602. The motherboard 1602 may include a number of components, including, but not limited to, a processor 1604 and at least one communication chip 1606, each of which can be physically and electrically coupled to the motherboard 1602, or otherwise integrated therein. As will be appreciated, the motherboard 1602 may be, for example, any printed circuit board (PCB), whether a main board, a daughterboard mounted on a main board, or the only board of system 1600, etc.

Depending on its applications, computing system 1600 may include one or more other components that may or may not be physically and electrically coupled to the motherboard 1602. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1600 may include one or more integrated circuit structures or devices configured in accordance with an example embodiment (e.g., a module including an integrated circuit device on a substrate, the substrate having one or more semiconductor devices with gates isolated from each other using self-aligned gate cut structures, as variously provided herein). In some embodiments, multiple functions can be integrated into one or more chips (e.g., for instance, note that the communication chip 1606 can be part of or otherwise integrated into the processor 1604).

The communication chip 1606 enables wireless communications for the transfer of data to and from the computing system 1600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1606 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1600 may include a plurality of communication chips 1606. For instance, a first communication chip 1606 may be dedicated to shorter range wireless communications such as Wi-Fi and Bluetooth and a second communication chip 1606 may be dedicated to longer range wireless communications such as GPS, EDGE, GPRS, CDMA, WiMAX, LTE, Ev-DO, and others.

The processor 1604 of the computing system 1600 includes an integrated circuit die packaged within the processor 1604. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 1606 also may include an integrated circuit die packaged within the communication chip 1606. In accordance with some such example embodiments, the integrated circuit die of the communication chip includes one or more semiconductor devices as variously described herein. As will be appreciated in light of this disclosure, note that multi-standard wireless capability may be integrated directly into the processor 1604 (e.g., where functionality of any chips 1606 is integrated into processor 1604, rather than having separate communication chips). Further note that processor 1604 may be a chip set having such wireless capability. In short, any number of processor 1604 and/or communication chips 1606 can be used. Likewise, any one chip or chip set can have multiple functions integrated therein.

In various implementations, the computing system 1600 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 1600 may be combined or integrated in a system-on-a-chip (SoC) architecture. In some embodiments, the components may be hardware components, firmware components, software components or any suitable combination of hardware, firmware or software.

Further Example Embodiments

The following examples pertain to further embodiments, from which numerous permutations and configurations will be apparent.

Example 1 is an integrated circuit that includes a first semiconductor device having a first semiconductor region extending between a first source region and a first drain region, and a second semiconductor device having a second semiconductor region extending between a second source region and a second drain region. The integrated circuit further includes a gate structure comprising a conductive material that extends over the first semiconductor region and the second semiconductor region, a spacer layer on sidewalls of the gate structure, and a gate cut structure that comprises a dielectric material. The gate cut structure is between the first semiconductor device and the second semiconductor device, such that the gate cut structure interrupts both the gate structure and the spacer layer. A first distance between the gate cut structure and the first semiconductor region is substantially the same as a second distance between the gate cut structure and the second semiconductor region.

Example 2 includes the subject matter of Example 1, wherein the first semiconductor region is a first fin comprising silicon and the second semiconductor region is a second fin comprising silicon, the first fin orientated parallel to the second fin.

Example 3 includes the subject matter of Example 1, wherein the first semiconductor region comprises a first plurality of semiconductor nanoribbons and the second semiconductor region comprises a second plurality of semiconductor nanoribbons.

Example 4 includes the subject matter of Example 3, wherein the first plurality of semiconductor nanoribbons and the second plurality of semiconductor nanoribbons comprise germanium, silicon, or an alloy thereof.

Example 5 includes the subject matter of any one of Examples 1-4, wherein the dielectric material comprises silicon and nitrogen or comprises silicon and oxygen.

Example 6 includes the subject matter of any one of Examples 1-5, wherein the gate cut structure is a first gate cut structure and the integrated circuit further comprises a second gate cut structure between the second semiconductor device and a third semiconductor device different from the first semiconductor device.

Example 7 includes the subject matter of any one of Examples 1-6, wherein the first semiconductor region, the second semiconductor region, and the gate cut structure each extends lengthwise in a first direction.

Example 8 includes the subject matter of Example 7, wherein the gate cut structure includes a seam that extends through a middle portion of the gate cut structure in the first direction, wherein the seam has a length that is equal to or greater than a width of the gate structure.

Example 9 is a printed circuit board comprising the integrated circuit of any one of Examples 1-8.

Example 10 is an electronic device that includes a chip package having one or more dies. At least one of the one or more dies includes a first semiconductor device having a first semiconductor region extending between a first source region and a first drain region, and a second semiconductor device having a second semiconductor region extending between a second source region and a second drain region. The integrated circuit further includes a gate structure comprising a conductive material that extends over the first semiconductor region and the second semiconductor region, a spacer layer on sidewalls of the gate structure, and a gate cut structure that comprises a dielectric material. The gate cut structure is between the first semiconductor device and the second semiconductor device, such that the gate cut structure interrupts both the gate structure and the spacer layer. A first distance between the gate cut structure and the first semiconductor region is substantially the same as a second distance between the gate cut structure and the second semiconductor region.

Example 11 includes the subject matter of Example 10, wherein the first semiconductor region is a first fin comprising silicon and the second semiconductor region is a second fin comprising silicon, the first fin orientated parallel to the second fin.

Example 12 includes the subject matter of Example 10, wherein the first semiconductor region comprises a first plurality of semiconductor nanoribbons and the second semiconductor region comprises a second plurality of semiconductor nanoribbons.

Example 13 includes the subject matter of Example 12, wherein the first plurality of semiconductor nanoribbons and the second plurality of semiconductor nanoribbons comprise germanium, silicon, or an alloy thereof.

Example 14 includes the subject matter of any one of Examples 10-13, wherein the dielectric material comprises silicon and nitrogen or comprises silicon and oxygen.

Example 15 includes the subject matter of any one of Examples 10-14, wherein the gate cut is a first gate cut and the at least one of the one or more dies further comprises a second gate cut between the second semiconductor device and a third semiconductor device different from the first semiconductor device.

Example 16 includes the subject matter of any one of Examples 10-15, wherein the first semiconductor region, the second semiconductor region, and the gate cut each extends lengthwise in a first direction.

Example 17 includes the subject matter of Example 16, wherein the gate cut includes a seam that extends through a middle portion of the gate cut in the first direction, wherein the seam has a length that is equal to or greater than a width of the gate structure.

Example 18 includes the subject matter of any one of Examples 10-17, further comprising a printed circuit board, wherein the chip package is attached to the printed circuit board.

Example 19 is a method of forming an integrated circuit. The method includes forming a first fin comprising first semiconductor material and a second fin comprising second semiconductor material, wherein the first fin and the second fin extend parallel to one another, the first fin having a first cap structure on a top surface of the first fin and the second fin having a second cap structure on a top surface of the second fin; forming a first spacer structure comprising a first material on at least a first side of the first fin facing the second fin and a second spacer structure comprising the first material on at least a second side of the second fin facing the first fin; depositing a second material different from the first material into a region between the first and second spacer structures and into regions between other spacer structures across the integrated circuit; removing the second material from between the first and second spacer structures and replacing the removed second material with a dielectric material; forming gate spacers on sidewalls of portions of the first material and second material; and forming a gate structure over the first semiconductor material and over the second semiconductor material between the gate spacers, wherein the dielectric material interrupts the gate structure between the first semiconductor material and the second semiconductor material and also interrupts the gate spacers.

Example 20 includes the subject matter of Example 19, wherein forming the first fin and the second fin comprises recessing a dielectric layer between the first and the second fins such that the first and the second fins extend above a top surface of the dielectric layer.

Example 21 includes the subject matter of Example 19 or 20, wherein a first di stance between the dielectric material and the first semiconductor material is substantially the same as a second distance between the dielectric material and the second semiconductor material.

Example 22 includes the subject matter of any one of Examples 19-21, wherein the first material comprises polysilicon and the second material comprises one of amorphous silicon, titanium nitride, aluminum oxide, or tungsten.

Example 23 includes the subject matter of any one of Examples 19-22, further comprising removing the second material from between other spacer structures and replacing the removed second material with the first material.

Example 24 includes the subject matter of any one of Examples 19-23, wherein replacing the removed second material with a dielectric material comprises forming the dielectric material using a chemical vapor deposition (CVD) process that forms a seam along a middle portion of the dielectric material.

Example 25 includes the subject matter of Example 24, wherein the seam has a length that is equal to or greater than a width of the gate.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit comprising:
   a first semiconductor device having a first semiconductor region extending in a first direction between a first source region and a first drain region;
   a second semiconductor device having a second semiconductor region extending in the first direction between a second source region and a second drain region;
   a gate structure comprising a conductive material, the gate structure extending over the first semiconductor region and the second semiconductor region;
   a first spacer layer on a first sidewall of the gate structure;
   a second spacer layer on a second sidewall of the gate structure, the second sidewall opposite from the first sidewall; and
   a gate cut structure comprising a dielectric material, the gate cut structure being between the first semiconductor device and the second semiconductor device such that the gate cut structure interrupts the gate structure, the first spacer layer, and the second spacer layer, wherein a first distance along a plane between the gate cut structure and the first semiconductor region is within 1.5 nm of a second distance along the plane between the gate cut structure and the second semiconductor region, and wherein the gate cut structure does not extend in the first direction beyond the first spacer layer and does not extend in the first direction beyond the second spacer layer.

2. The integrated circuit of claim 1, wherein the first semiconductor region comprises a first plurality of semiconductor nanoribbons and the second semiconductor region comprises a second plurality of semiconductor nanoribbons.

3. The integrated circuit of claim 2, wherein the first plurality of semiconductor nanoribbons and the second plurality of semiconductor nanoribbons comprise germanium, silicon, or an alloy thereof.

4. The integrated circuit of claim 1, wherein the dielectric material comprises silicon and nitrogen or comprises silicon and oxygen.

5. The integrated circuit of claim 1, wherein the gate cut structure is a first gate cut structure and the integrated circuit further comprises a second gate cut structure between the second semiconductor device and a third semiconductor device different from the first semiconductor device.

6. The integrated circuit of claim 1, wherein the gate cut structure includes a seam that extends through a middle portion of the gate cut structure in the first direction, wherein the seam has a length that is equal to or greater than a width of the gate structure.

7. A die comprising the integrated circuit of claim 1.

8. An electronic device, comprising:
a chip package comprising one or more dies, at least one of the one or more dies comprising
a first semiconductor device having a first semiconductor region extending in a first direction between a first source region and a first drain region;
a second semiconductor device having a second semiconductor region extending in the first direction between a second source region and a second drain region;
a gate structure comprising a conductive material, the gate structure extending over the first semiconductor region and the second semiconductor region;
a first spacer layer on a first sidewall of the gate structure;
a second spacer layer on a second sidewall of the gate structure, the second sidewall opposite from the first sidewall; and
a gate cut comprising a dielectric material, the gate cut being between the first semiconductor device and the second semiconductor device such that the gate cut interrupts the gate structure, the first spacer layer, and the second spacer layer, wherein a first distance between the gate cut and the first semiconductor region is within 1.5 nm of a second distance between the gate cut and the second semiconductor region, and wherein the gate cut structure does not extend in the first direction beyond the first spacer layer and does not extend in the first direction beyond the second spacer layer.

9. The electronic device of claim 8, wherein the first semiconductor region comprises a first plurality of semiconductor nanoribbons and the second semiconductor region comprises a second plurality of semiconductor nanoribbons.

10. The electronic device of claim 9, wherein the first plurality of semiconductor nanoribbons and the second plurality of semiconductor nanoribbons comprise germanium, silicon, or an alloy thereof.

11. The electronic device of claim 8, wherein the dielectric material comprises silicon and nitrogen or comprises silicon and oxygen.

12. The electronic device of claim 8, wherein the gate cut is a first gate cut and the at least one of the one or more dies further comprises a second gate cut between the second semiconductor device and a third semiconductor device different from the first semiconductor device.

13. The electronic device of claim 8, wherein the gate cut includes a seam that extends through a middle portion of the gate cut in the first direction, wherein the seam has a length that is equal to or greater than a width of the gate structure.

14. The electronic device of claim 8, further comprising a printed circuit board, wherein the chip package is attached to the printed circuit board.

15. An integrated circuit comprising:
a first semiconductor region extending in a first direction from a first source or drain region;
a second semiconductor region extending in the first direction from a second source or drain region;
a first gate structure extending over the first semiconductor region in a second direction different from the first direction;
a second gate structure extending over the second semiconductor region in the second direction;
a first spacer layer on a first sidewall of the first gate structure;
a second spacer layer on a second sidewall of the first gate structure, the second sidewall opposite from the first sidewall; and
a gate cut structure comprising a dielectric material, the gate cut structure extending along the first direction between the first gate structure and the second gate structure, and along the first direction through the first spacer layer and through the second spacer layer, wherein a first distance between the gate cut structure and the first semiconductor region is within 1.5 nm of a second distance between the gate cut structure and the second semiconductor region, and wherein the gate cut structure does not extend in the first direction beyond the first spacer layer and does not extend in the first direction beyond the second spacer layer.

16. The integrated circuit of claim 15, wherein the gate cut includes a seam that extends through a middle portion of the gate cut in the first direction, wherein the seam has a length that is equal to or greater than a width of the first and second gate structures.

17. The integrated circuit of claim 15, wherein the first semiconductor region comprises a first plurality of semiconductor nanoribbons and the second semiconductor region comprises a second plurality of semiconductor nanoribbons.

18. The integrated circuit of claim 17, wherein the first plurality of semiconductor nanoribbons and the second plurality of semiconductor nanoribbons comprise germanium, silicon, or an alloy thereof.

19. The integrated circuit of claim 15, wherein the gate cut structure is a first gate cut structure and the integrated circuit further comprises a second gate cut structure between the second gate structure and a third gate structure different from the first gate structure.

20. The integrated circuit of claim 15, wherein the dielectric material comprises silicon and nitrogen or comprises silicon and oxygen.

\* \* \* \* \*